(12) United States Patent
Chuang et al.

(10) Patent No.: US 11,217,627 B2
(45) Date of Patent: Jan. 4, 2022

(54) MAGNETIC RANDOM ACCESS MEMORY DEVICE AND FORMATION METHOD THEREOF

(71) Applicant: TAIWAN SEMICONDUCTOR MANUFACTURING CO., LTD., Hsinchu (TW)

(72) Inventors: Harry-Hak-Lay Chuang, Hsinchu County (TW); Jiun-Yu Tsai, Hsinchu (TW); Sheng-Huang Huang, Hsinchu (TW); Ming-Che Ku, Hsinchu (TW); Hung-Cho Wang, Taipei (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/886,480

(22) Filed: May 28, 2020

(65) Prior Publication Data
US 2021/0098529 A1   Apr. 1, 2021

Related U.S. Application Data

(60) Provisional application No. 62/907,357, filed on Sep. 27, 2019.

(51) Int. Cl.
*H01L 27/22* (2006.01)
*H01L 43/12* (2006.01)
*H01L 43/02* (2006.01)
*H01L 23/522* (2006.01)
*H01L 23/528* (2006.01)
*H01L 43/10* (2006.01)

(52) U.S. Cl.
CPC .......... *H01L 27/222* (2013.01); *H01L 23/528* (2013.01); *H01L 23/5226* (2013.01); *H01L 43/02* (2013.01); *H01L 43/10* (2013.01); *H01L 43/12* (2013.01)

(58) Field of Classification Search
CPC . H01L 27/222; H01L 23/5226; H01L 23/528; H01L 43/02; H01L 43/10; H01L 43/12
USPC ........................................... 257/421
See application file for complete search history.

(56) References Cited

U.S. PATENT DOCUMENTS 10,483,461 B2 * 11/2019 Yi ................. H01L 23/5283

* cited by examiner

*Primary Examiner* — Tu-Tu V Ho
(74) *Attorney, Agent, or Firm* — Maschoff Brennan

(57) ABSTRACT

A method of forming a MRAM device includes forming an interconnect structure spanning a memory region and a peripheral region; forming a MTJ stack over the interconnect structure within the memory region; depositing a dielectric layer over the MTJ stack and spanning the memory region and the peripheral region; removing a first portion of the dielectric layer from the peripheral region, while leaving a second portion of the dielectric layer within the memory region; after removing the first portion of the dielectric layer from the peripheral region, forming a first IMD layer spanning the memory region and the peripheral region; forming a dual damascene structure through the first IMD layer to a metallization pattern of the interconnect structure within the peripheral region; and after forming the dual damascene structure within the peripheral region, forming a top electrode via in contact with a top electrode of the MTJ stack.

20 Claims, 27 Drawing Sheets

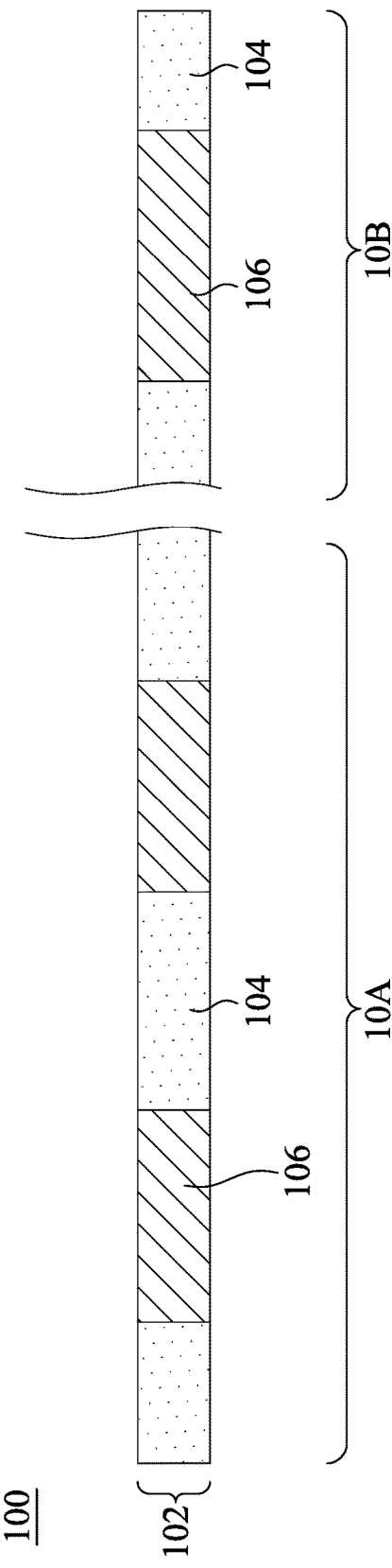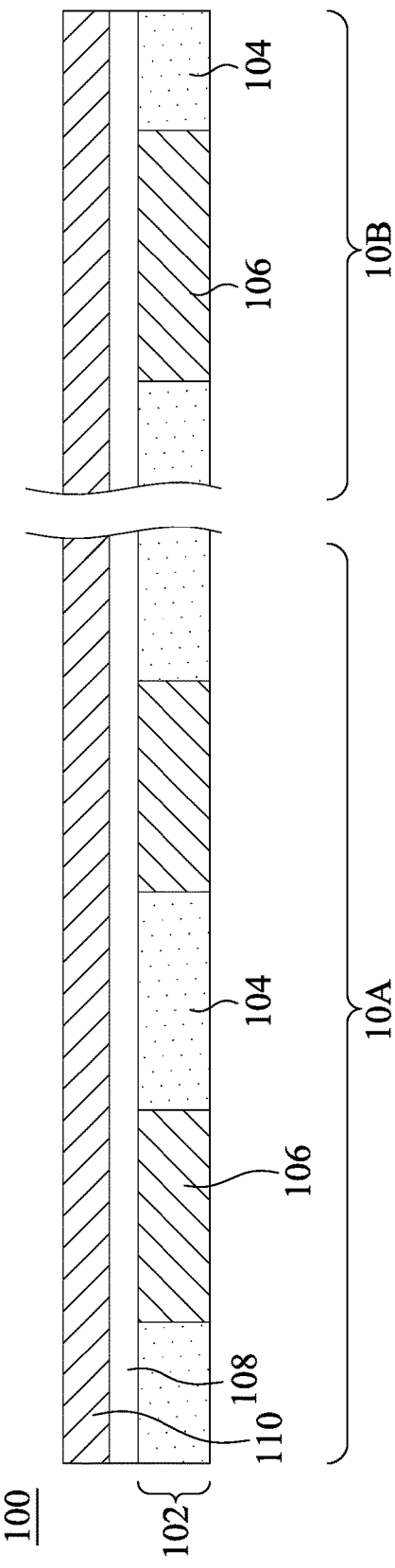

MAGNETIC RANDOM ACCESS MEMORY DEVICE AND FORMATION METHOD THEREOF

PRIORITY CLAIM AND CROSS-REFERENCE

This application claims priority to U.S. Provisional Application Ser. No. 62/907,357, filed Sep. 27, 2019, which is herein incorporated by reference.

BACKGROUND

Semiconductor memories are used in integrated circuits for electronic applications, including radios, televisions, cell phones, and personal computing devices, as examples. One type of semiconductor memory device involves spin electronics, which combines semiconductor technology and magnetic materials and devices. The spins of electrons, through their magnetic moments, rather than the charge of the electrons, are used to indicate a bit.

One such spin electronic device is magnetoresistive random access memory (MRAM) array, which includes metal lines (word lines and bit lines) positioned in different directions, e.g., perpendicular to each other in different metal layers. The metal lines sandwich a magnetic tunnel junction (MTJ), which functions as a magnetic memory cell.

BRIEF DESCRIPTION OF THE DRAWINGS

Aspects of the present disclosure are best understood from the following detailed description when read with the accompanying Figures. It is noted that, in accordance with the standard practice in the industry, various features are not drawn to scale. In fact, the dimensions of the various features may be arbitrarily increased or reduced for clarity of discussion.

FIGS. 1 to 27 are cross-sectional views of a MRAM device at various stages of manufacture according to various embodiments.

DETAILED DESCRIPTION

Figure 3:
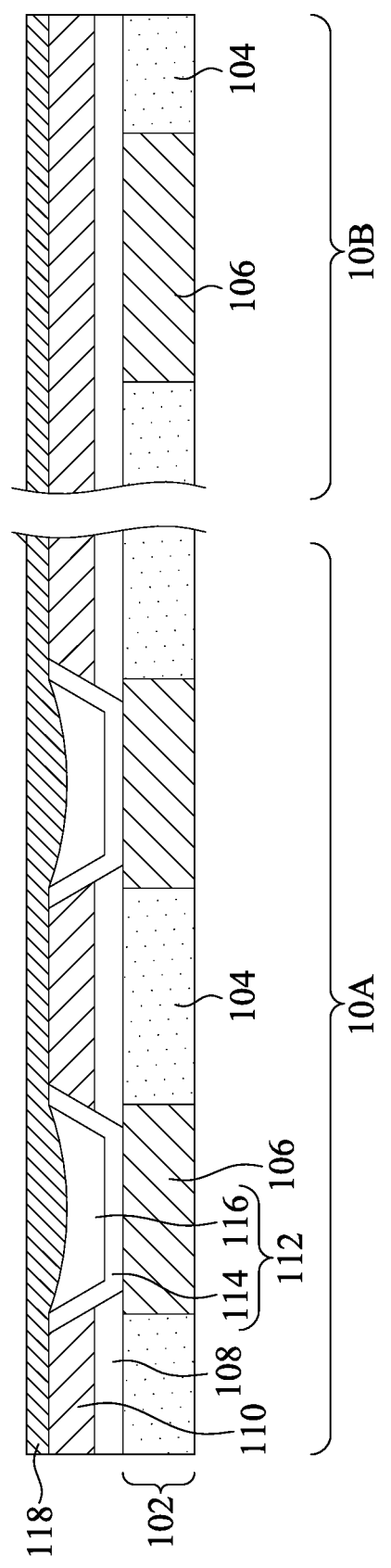

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the Figures. The spatially relative terms are intended to encompass different orientations of the device in use or operation in addition to the orientation depicted in the Figures. The apparatus may be otherwise oriented (rotated 90 degrees or at other orientations) and the spatially relative descriptors used herein may likewise be interpreted accordingly.

FIG. 1 is a cross-sectional view of a MRAM device 100 at an intermediate stage of manufacture according to various embodiments of the present disclosure. FIGS. 1 to 25 are cross-sectional views of a MRAM device 100 at various stages of manufacture according to various embodiments. Various figures have been simplified for a better understanding of the inventive concepts of the present disclosure. Reference is made to FIG. 1. In some embodiments, an interconnect structure 102 having an inter-layer dielectric (ILD) layer 104 or inter-metal dielectric layer (IMD) layer with metallization patterns 106 is formed over a substrate (not shown in FIG. 1). The ILD layer 104 may be silicon oxide, fluorinated silica glass (FSG), carbon doped silicon oxide, tetra-ethyl-ortho-silicate (TEOS) formed oxide, phosphosilicate glass (PSG), borophosphosilicate glass (BPSG), Black Diamond® (Applied Materials of Santa Clara, Calif.), amorphous fluorinated carbon, low-k dielectric material, the like or combinations thereof. The metallization patterns 106 may be aluminum, aluminum alloy, copper, copper alloy, titanium, titanium nitride, tantalum, tantalum nitride, tungsten, the like, and/or combinations thereof. Formation of the metallization patterns 106 and the ILD layer 104 may be a dual-damascene process and/or a single-damascene process. The MRAM device 100 includes a memory region 10A and a periphery region 10B. The memory region 10A is for the use of a 1T-RAM cell, and the periphery region 10B is for the use of core circuits or I/O circuits.

Reference is then made to FIG. 2. An etch stop layer 108 may be blanket formed over the interconnect structure 102. The etch stop layer 108 controls the end point of a subsequent etch process. In In various embodiments, the etch stop layer 108 may be formed by a vapor deposition technique (e.g., physical vapor deposition, chemical vapor deposition, etc.) and include a silicon nitride (SiN) layer, a silicon carbide (SiC) layer, a silicon oxycarbide (SiOC) layer, and/or some other suitable etch stop layers. A dielectric layer 110 is formed over the etch stop layer 108. The dielectric layer 110 may be formed by acceptable deposition techniques, such as chemical vapor deposition (CVD), atomic layer deposition (ALD), physical vapor deposition (PVD), the like, and/or a combination thereof. A chemical-mechanical polish (CMP) process is optionally performed to the dielectric layer 110, until a desirable thickness is achieved. The dielectric layer 110 can be, for example, a silicon rich oxide (SRO) layer (e.g., having a silicon atomic concentration greater than about 34%), a silicon dioxide layer, a silicon carbide layer, a silicon nitride layer, a silicon oxycarbide layer, a silicon oxynitride layer, a low-k dielectric (e.g., having a dielectric constant of less than about 3.9) layer, an extreme low-k (ELK) dielectric (e.g., having a dielectric constant of less than about 2.5) layer, the like, or combinations thereof. In some embodiments, a thickness of the dielectric layer 110 is in a range from about 200 angstrom to about 800 angstrom.

Figure 26:
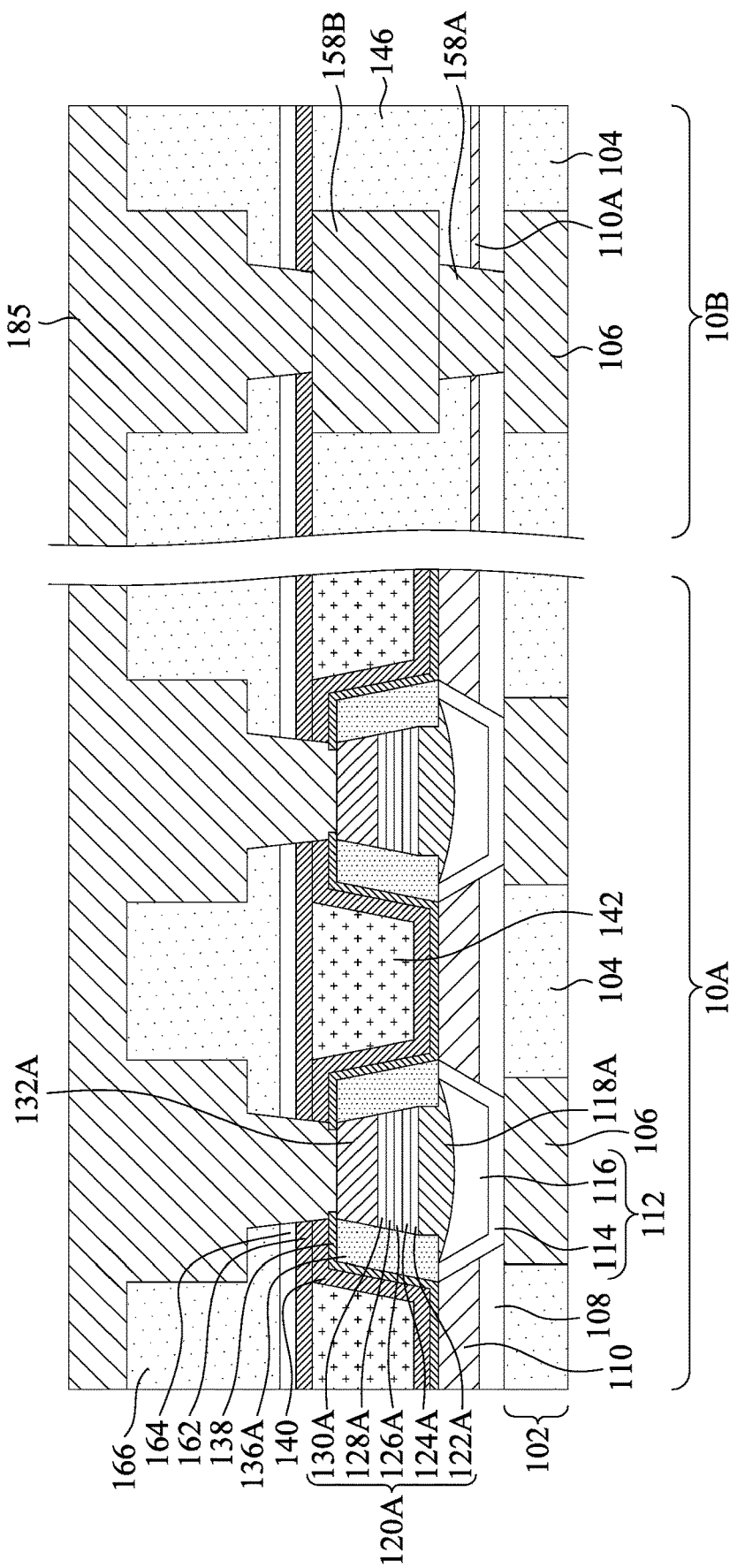

A bottom electrode via (BEVA) 112 is then formed within the dielectric layer 110 and the etch stop layer 108, as illustrated in FIG. 3. In some embodiments, the BEVA 112 is a multi-layered structure and includes, for example, a diffusion barrier layer 114 and a filling metal 116 filling a recess in the diffusion barrier layer 114. An exemplary formation method of the BEVA 112 includes etching an opening in the dielectric layer 110 and the etch stop layer 108, forming in sequence the diffusion barrier layer 114 and the filling metal 116 into the opening using suitable one or more deposition techniques, and performing a planarization process, such as a CMP process, to remove excess materials of the filling metal 116 outside the opening in the dielectric layer 110. The remaining diffusion barrier layer 114 and the remaining filling metal 116 in the opening in the dielectric layer 110 and the etch stop layer can serve as the BEVA 112. In some embodiments, the BEVA 112 has a concave top surface, due to the dishing effect of the CMP process. In some embodiments, the BEVA 112 is electrically connected to an underlying electrical component, such as a transistor (e.g., transistor as shown in FIG. 26), through the back-end-of-line (BEOL) interconnect structure that includes the metallization patterns 106. In some embodiments, the diffusion barrier layer 114 is a titanium nitride (TiN) layer or a tantalum nitride (TaN) layer, which can act as a suitable barrier to prevent metal diffusion. Formation of the diffusion barrier layer 114 may be exemplarily performed using CVD, PVD, ALD, the like, and/or a combination thereof. In some embodiments, the filling metal 116 is titanium (Ti), tantalum (Ta), platinum (Pt), ruthenium (Ru), tungsten (W), aluminum (Al), copper (Cu), the like, and/or combinations thereof. Formation of the filling metal 116 may be exemplarily performed using CVD, PVD, ALD, the like, and/or a combination thereof.

A bottom electrode layer 118 is then blank formed over the BEVA 112 and over the dielectric layer 110, so that the bottom electrode layer 118 extends along top surfaces of the BEVA 112 and of the dielectric layer 110. In some embodiments, the bottom electrode layer 118 is titanium (Ti), tantalum (Ta), platinum (Pt), ruthenium (Ru), tungsten (W), aluminum (Al), copper (Cu), the like, and/or a combination thereof. Formation of the bottom electrode layer 118 may be exemplarily performed using CVD, PVD, ALD, the like, and/or a combination thereof. Moreover, the bottom electrode layer 118 has a convex surface interfaced with the concave surface of the BEVA 112.

Figure 4:
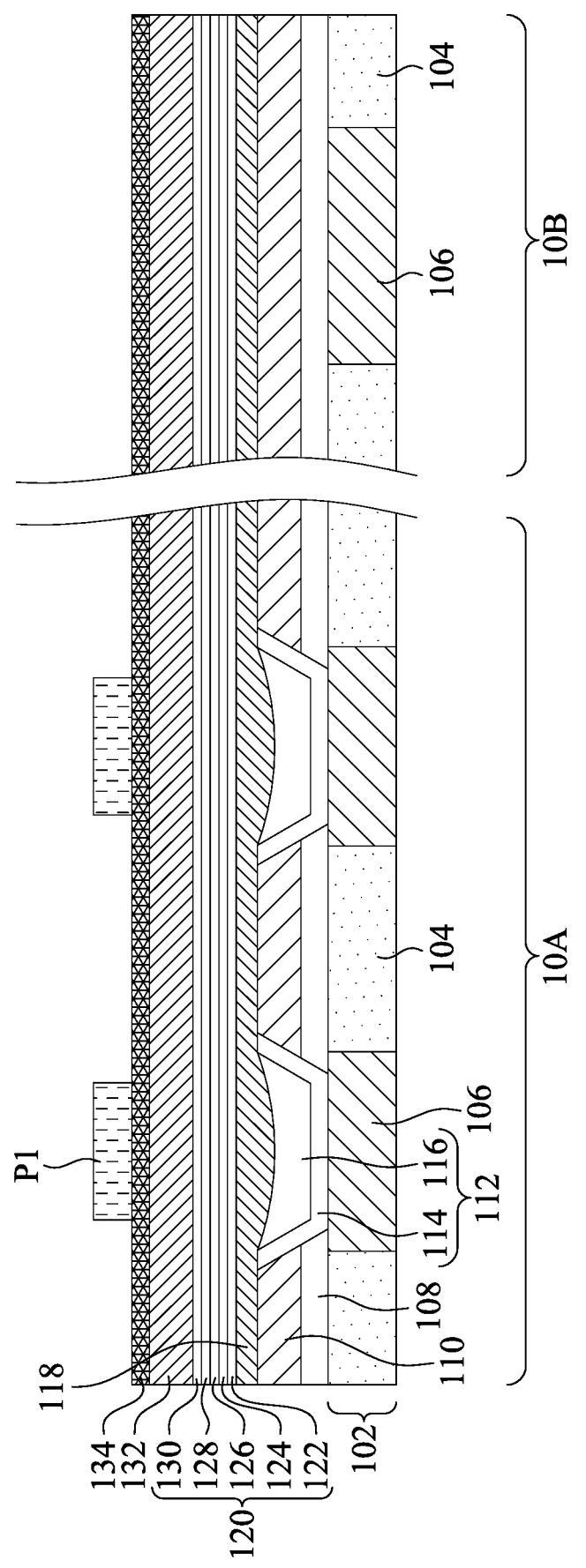

Reference is made to FIG. 4. A Magnetic tunnel junction (MTJ) layer stack 120 is formed over the bottom electrode layer 118. The MTJ layer stack 120 includes a seed layer 122, a ferromagnetic pinned layer 124, a tunneling layer 126, a ferromagnetic free layer 128, and a capping layer 130 formed in sequence over the bottom electrode layer 118. The seed layer 122 includes Ta, TaN, Cr, Ti, TiN, Pt, Mg, Mo, Co, Ni, Mn, or alloys thereof, and serves to promote a smooth and uniform grain structure in overlying layers. The ferromagnetic pinned layer 124 may be formed of an anti ferromagnetic (AFM) layer and a pinned ferroelectric layer over the AFM layer. The AFM layer is used to pin or fix the magnetic direction of the overlying pinned ferroelectric layer. The ferromagnetic pinned layer 124 may be formed of, for example, ferroelectric metal or alloy (e.g., Co, Fe, Ni, B, Mo, Mg, Ru, Mn, Ir, Pt, or alloys thereof).

The tunneling layer 126 is formed over the ferromagnetic pinned layer 124. The tunneling layer 126 is thin enough that electrons are able to tunnel through the tunneling layer 126 when a biasing voltage is applied on a resulting MTJ stack 120A fabricated from the MTJ layer stack 120. In some embodiments, the tunneling layer 126 includes magnesium oxide (MgO), aluminum oxide ($Al_2O_3$), aluminum nitride (AlN), aluminum oxynitride (AlON), hafnium oxide ($HfO_2$) or zirconium oxide ($ZrO_2$), or combinations thereof. Exemplary formation methods of the tunneling layer 126 include sputtering, PVD, ALD, or the like.

Still referring to FIG. 4, the ferromagnetic free layer 128 is formed over the tunneling layer 126. A direction of a magnetic moment of the ferromagnetic free layer 128 is not pinned because there is no anti-ferromagnetic material adjacent the ferromagnetic free layer 128. Therefore, the magnetic orientation of this layer 128 is adjustable, thus the layer 128 is referred to as a free layer. In some embodiments, the direction of the magnetic moment of the ferromagnetic free layer 128 is free to rotate parallel or anti-parallel to the pinned direction of the magnetic moment of the ferromagnetic pinned layer 124. The ferromagnetic free layer 128 may include a ferromagnetic material similar to the material in the ferromagnetic pinned layer 124. In some embodiments, the ferromagnetic free layer 128 includes Co, Fe, B, Mo, or combinations thereof. Exemplary formation methods of the ferromagnetic free layer 128 include sputtering, PVD, ALD, or the like.

The capping layer 130 is deposited over the ferromagnetic free layer 128. The capping layer 130 includes Ta, Co, B, Ru, Mo, MgO, AlO, or combinations thereof. The material of the capping layer 130 is chosen such that it has an adequate etching resistance in a subsequent etching which will be described details later. A thickness of the capping layer 130 is chosen such that it provides an adequate protection for the ferromagnetic free layer 128 in the subsequent etching and a satisfactory tunneling magnetoresistance (TMR) of the MRAM device 100. The capping layer 130 may be deposited by PVD or alternatively other suitable processes.

A top electrode layer 132 is formed on the capping layer 130. In some embodiments, the top electrode layer 132 is similar to the bottom electrode layer 118 in terms of composition. In some embodiments, the top electrode layer 132 includes Ti, Ta, Ru, W, TaN, TiN, the like or combinations thereof. An exemplary formation method of the top electrode layer 132 includes sputtering, PVD, ALD or the like.

A hard mask layer 134 is optionally formed over the top electrode layer 132. In some embodiments, the hard mask layer 134 may be silicon carbide (SiC), silicon oxynitride (SiON), silicon nitride (SiN), silicon dioxide ($SiO_2$), the like, and/or combinations thereof. The hard mask layer 134 may be formed by acceptable deposition techniques, such as CVD, ALD, PVD, the like, and/or combinations thereof. In some embodiments, the hard mask layer 134 can be omitted.

In some embodiments, a patterned resist mask P1 is formed over the hard mask layer 134. A resist layer is formed over the hard mask layer 134 and then patterned into the patterned resist mask P1 using a suitable photolithography process, such that portions of the hard mask layer 134 are exposed by the patterned resist mask P1. In some embodiments, the patterned resist mask P1 is a photoresist. In some embodiments, the patterned resist mask P1 is an ashing removable dielectric (ARD), which is a photoresist-like material generally having generally the properties of a photoresist and amendable to etching and patterning like a photoresist. An exemplary photolithography process may include photoresist coating (e.g., spin-on coating), soft baking, mask aligning, exposure, post-exposure baking, developing the photoresist, rinsing, drying (e.g., hard baking), other suitable processes, or combinations thereof.

Figure 5:
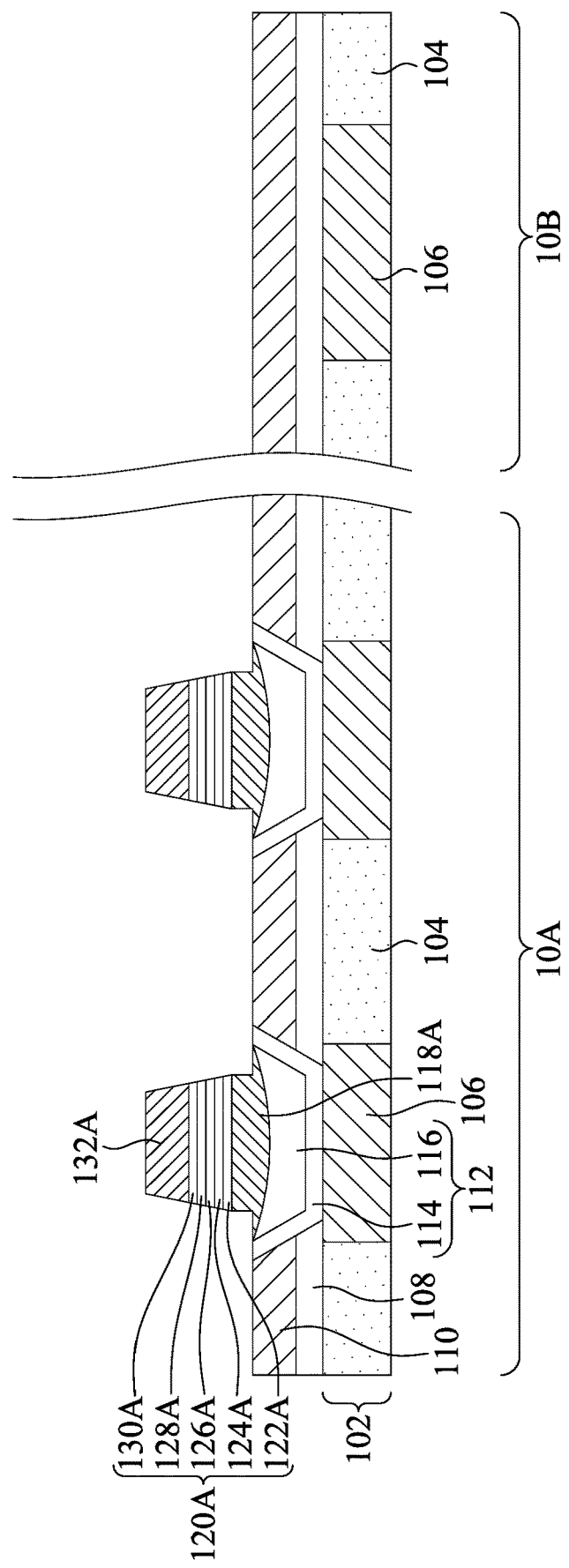

Reference is made to FIG. 5. An etching process is performed to pattern the top electrode layer 132, the MTJ layer stack 120 and the bottom electrode layer 118 exposed by the hard mask layer 134. Portions of the top electrode layer 132, the MTJ layer stack 120 and the bottom electrode layer 118 are removed. Remaining capping layer 130A, remaining ferroelectric free layer 128A, remaining tunneling layer 126A, remaining ferroelectric pinned layer 124A and remaining seed layer 122A are in referred to as an MTJ stack 120A. The patterned resist mask P1 and the hard mask layer 134 are then removed using suitable processes such as ashing and/or etching. After the etching process, a top surface and a sidewall of the bottom electrode 118A and a top surface of the diffusion barrier layer 114 are exposed.

Figure 6:
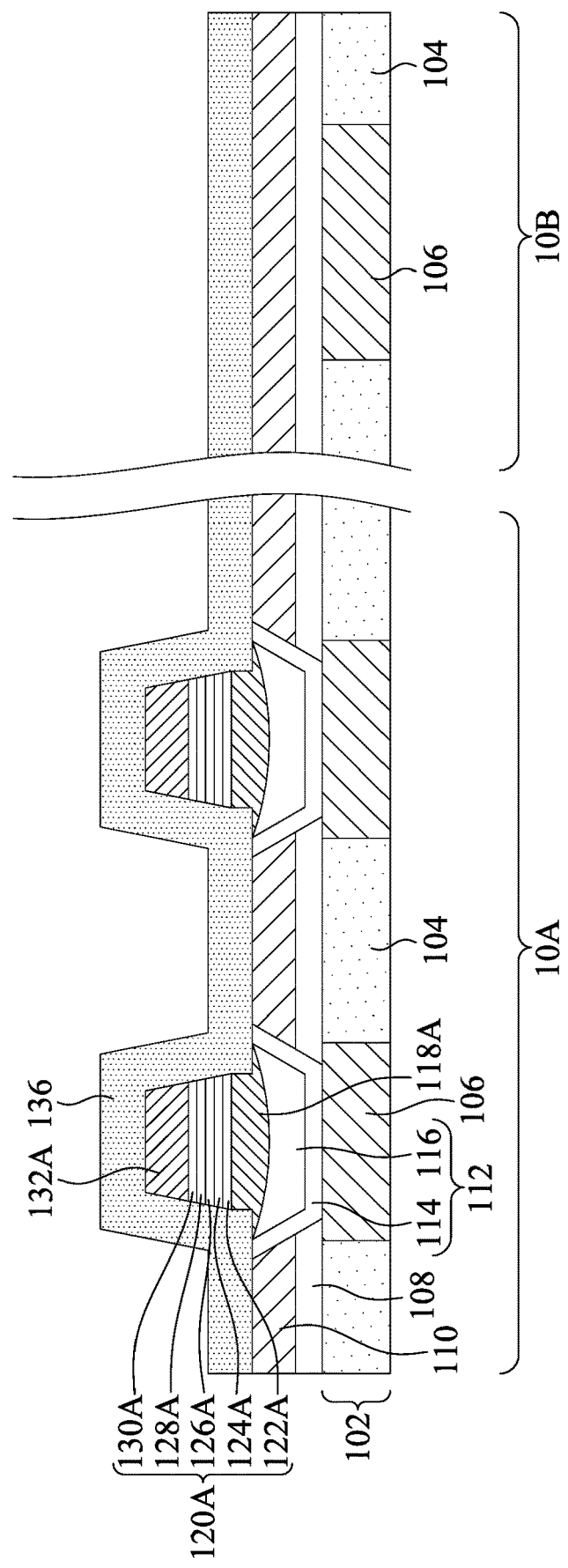

Reference is made to FIG. 6. A spacer layer 136 is formed over top surfaces of the dielectric layer 110, the diffusion barrier layer 114, the bottom electrode 118' and along sidewalls of the bottom electrode 118A, the MTJ stack 120A, and the top electrode 132A and over a top surface of the top electrode 132A.

Figure 7:
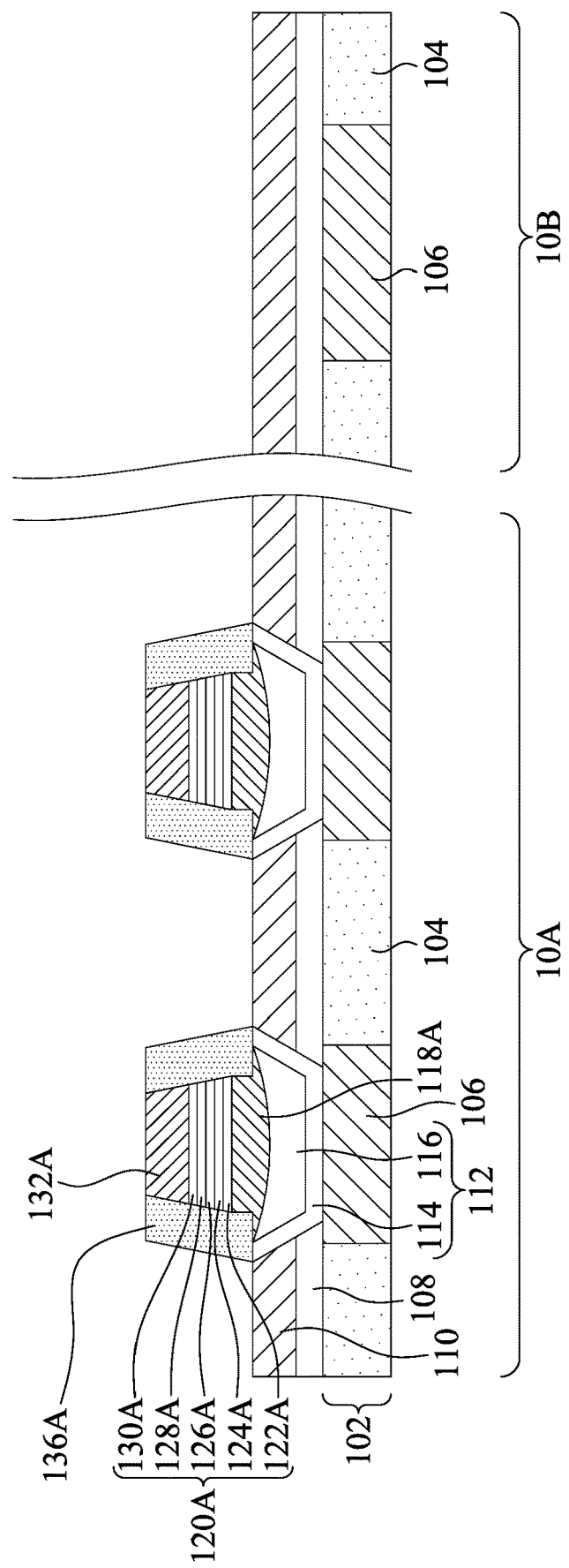

Reference is made to FIG. 7. An etching process is performed to pattern the spacer layer 136 into spacers 136A laterally surrounding the respective MTJ stacks 120A. The etching process may be an anisotropic etch process. After the etching process, the top surfaces of the top electrode 132A and the dielectric layer 110 is exposed. The spacer 136A is in contact with and surrounds the sidewall of the bottom electrode 118A, the sidewall of the MTJ stack 120A, and the sidewalls of the top electrode 132A to prevent from oxidation or other contamination.

Figure 8:
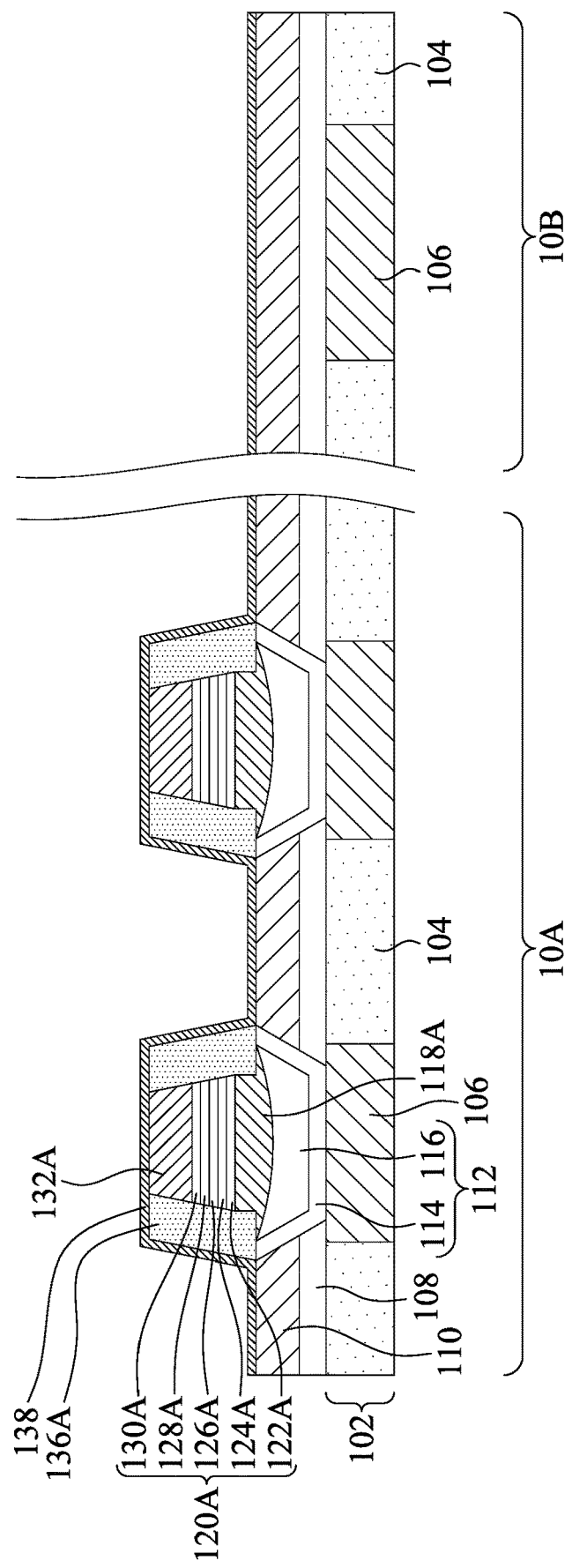

Reference is made to FIG. 8. A etch stop layer 138 is formed over the exposed top surface of the dielectric layer 110, along a sidewall of the spacer 136A and over a top surface of the spacer 136A and the top surface of the top electrode 132A. The etch stop layer 138 in some embodiments may include aluminum oxide, aluminum nitride, titanium nitride, the like, or combinations thereof. The etch stop layer 138 may be formed using CVD, PVD, ALD, the like, and/or combinations thereof.

Figure 9:
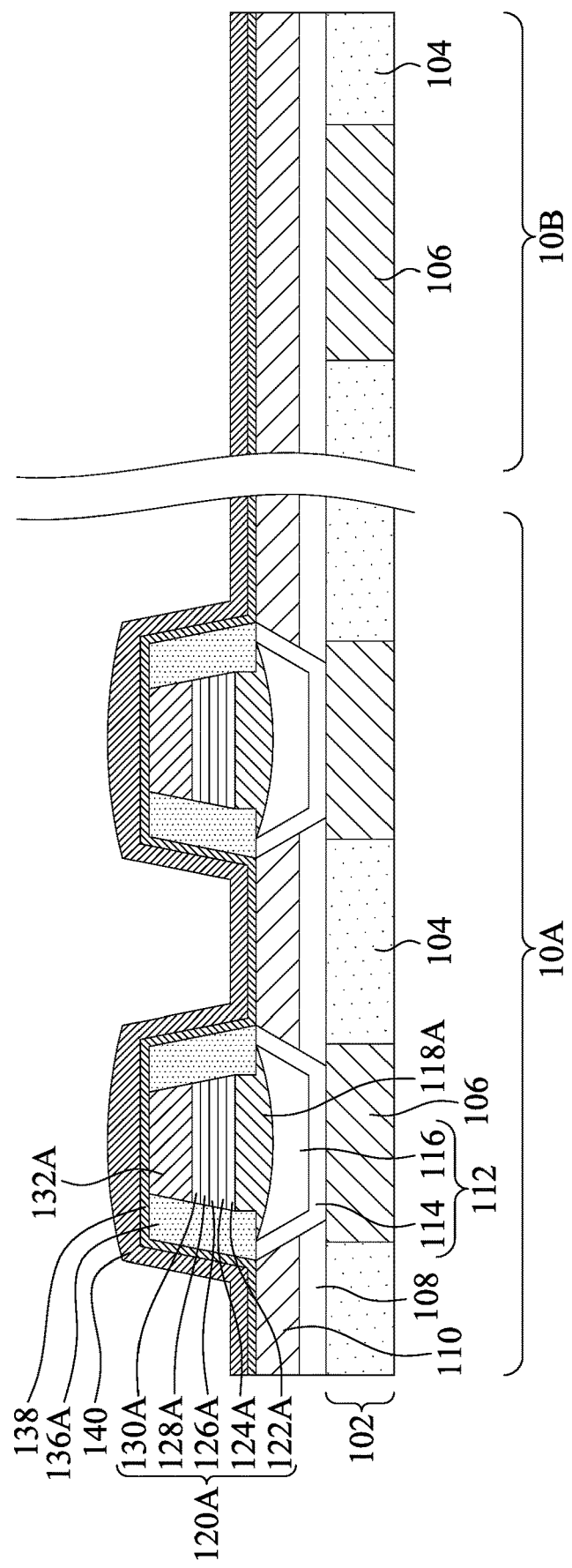

Reference is made to FIG. 9. A CMP stop layer 140 is formed lining the etch stop layer 138. In some embodiments, a material of the CMP stop layer 140 is different from a material of the etch stop layer 138. The CMP stop layer 140 in some embodiments may include silicon carbide, silicon nitride, silicon oxynitride, the like, or combinations thereof. The CMP stop layer 140 may be formed using CVD, PVD, ALD, the like, and/or combinations thereof.

Figure 10:
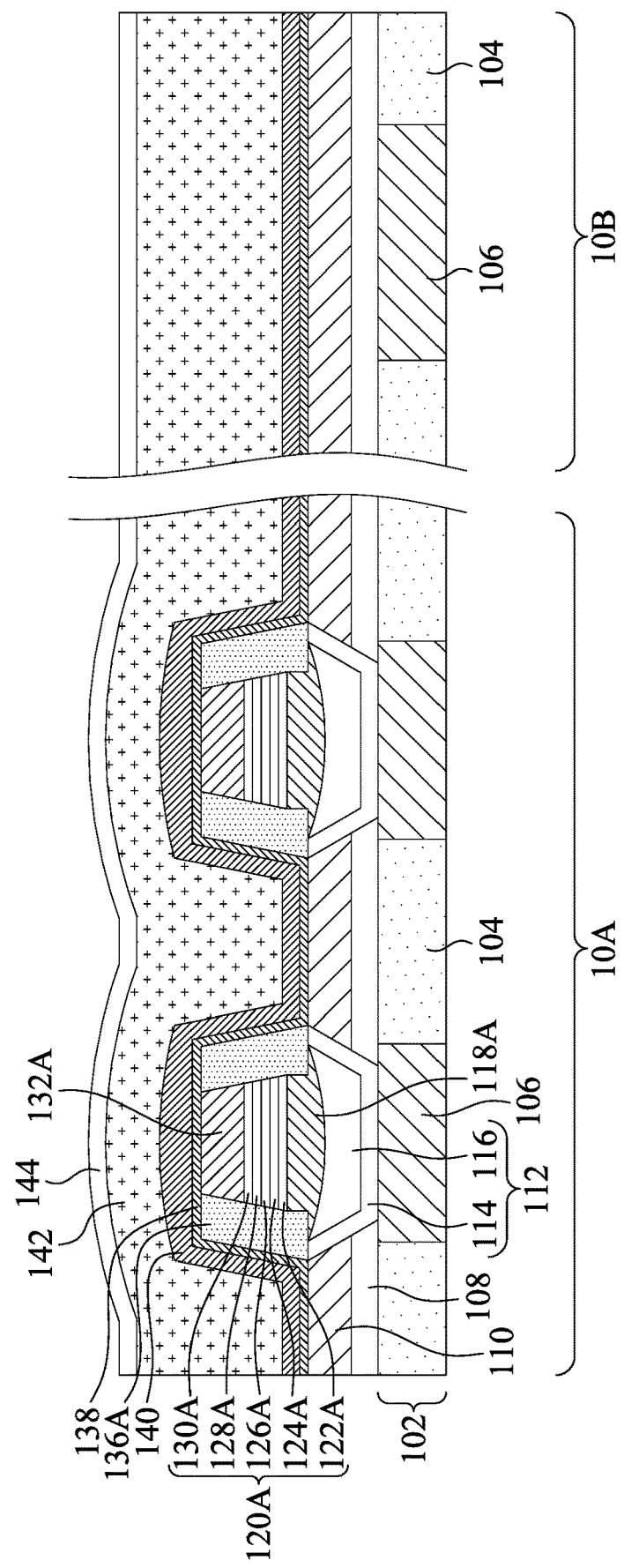

Reference is made to FIG. 10. A dielectric layer 142 and a capping layer 144 are formed over the CMP stop layer 140 in sequence. A material of the dielectric layer 142 is different from a material of the capping layer 144. The dielectric layer 142 may be formed of silicon oxide, tetraethyl ortho-silicate (TEOS) oxide, silicon nitride, combinations thereof, or the like. The deposition of the dielectric layer 142 can be carried out using any of a variety of techniques, including LPCVD (low-pressure chemical vapor deposition), APCVD (atmospheric-pressure chemical vapor deposition), PECVD (plasma-enhanced chemical vapor deposition), ALD (atomic layer deposition), or PEALD (plasma-enhanced atomic layer deposition). The capping layer 144 may be formed of silicon oxynitride in some embodiments. In various embodiments, the capping layer 144 may be formed by a vapor deposition technique (e.g., physical vapor deposition, chemical vapor deposition, etc).

Figure 11:
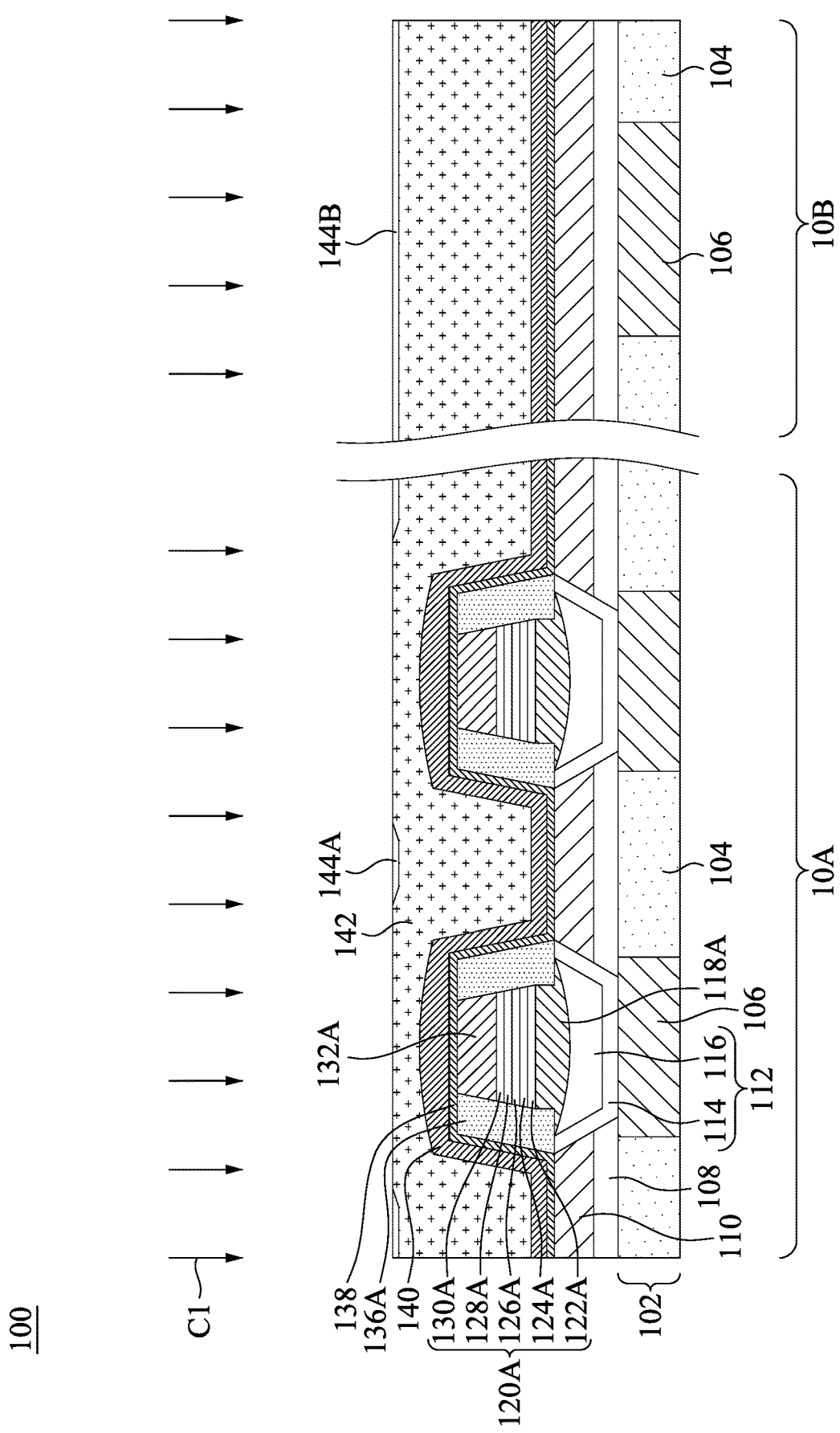

A portion of the capping layer 144 and a portion of the dielectric layer 142 are removed by a CMP process C1, leaving a plurality of first portions 144A and a second portion 144B of the capping layer 144 over the dielectric layer 142, as shown in FIG. 11. The dielectric layer 142 is exposed after the CMP process C1. A thickness of the first portions 144A and a thickness of the second portion 144B both are less than a thickness of the capping layer 144 before the CMP process C1. In some embodiments, the first portions 144A and the second portion 144B have substantially the same thickness. By way of example and not limitation, the CMP process C1 removes the material of the capping layer 144 (e.g., silicon oxynitride) at a slower rate than it removes the material of the dielectric layer 142 (e.g., silicon oxide). The CMP stop layer 140 below the dielectric layer 142 can prevent the top electrode 132A from being damaged in case that the dielectric layer 142 is over-polished during the CMP process C1. By way of example and not limitation, the CMP stop layer 140 can be made of SiC, SiN, SiON or other materials except for silicon oxide.

Figure 12:
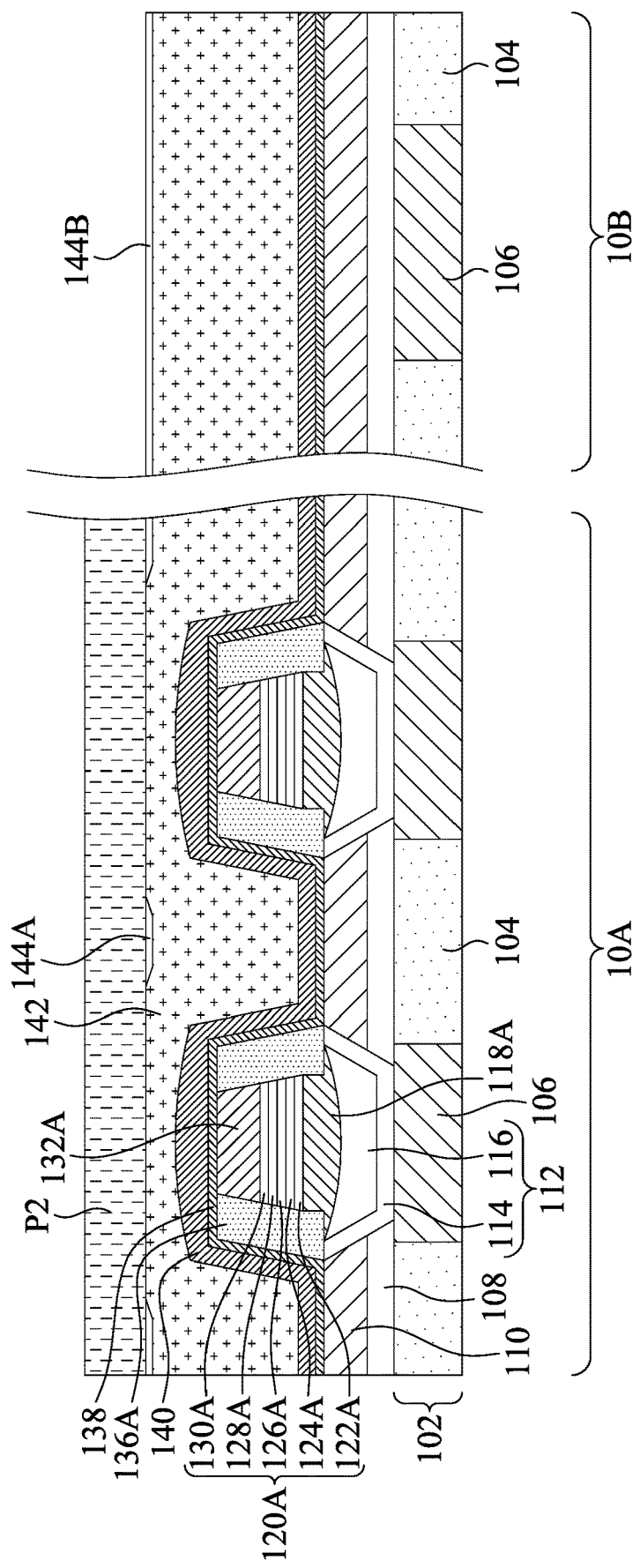

Reference is made to FIG. 12. A photoresist mask P2 is formed and patterned over the dielectric layer 142. Like other photoresist masks, the photoresist mask P2 may be formed by a process that includes spin-coating or otherwise forming a photoresist on a surface of the structure, selectively exposing the photoresist to light through a reticle or other photolithographic mask, and removing the exposed or unexposed portion using a chemical developer.

Figure 13:
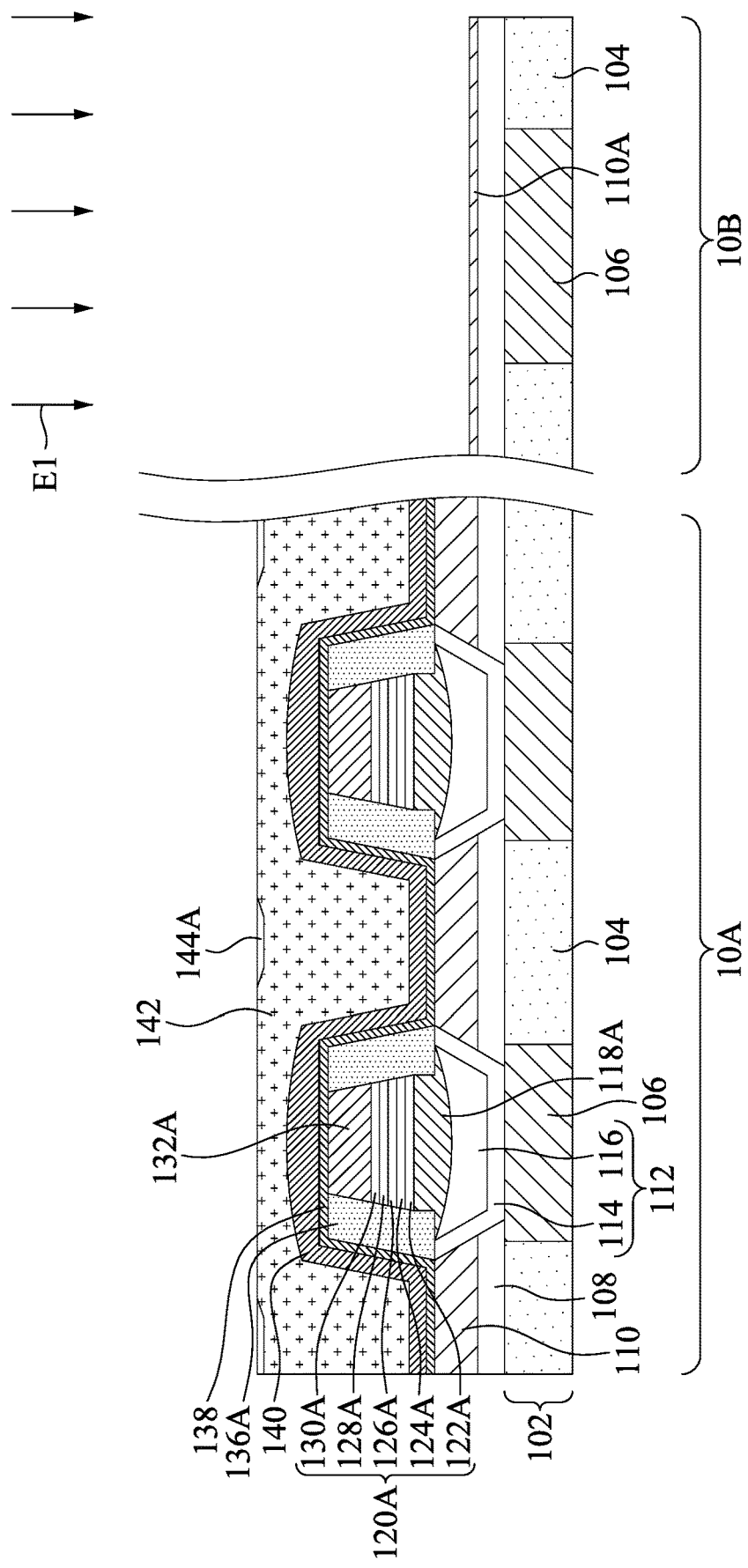

Reference is made to FIG. 13. An etch E1 may be performed to remove the dielectric layer 142, the CMP stop layer 140, the etch stop layer 138, and a portion of the dielectric layer 110 on the periphery region 10B such that the dielectric layer 110 is thinned and exposed. A remaining portion 110A of the dielectric layer 110 has a thickness in a range from about 50 angstrom to about 170 angstrom. Remainder of the photoresist mask P2 is removed, for example, by an ashing step.

Figure 14:
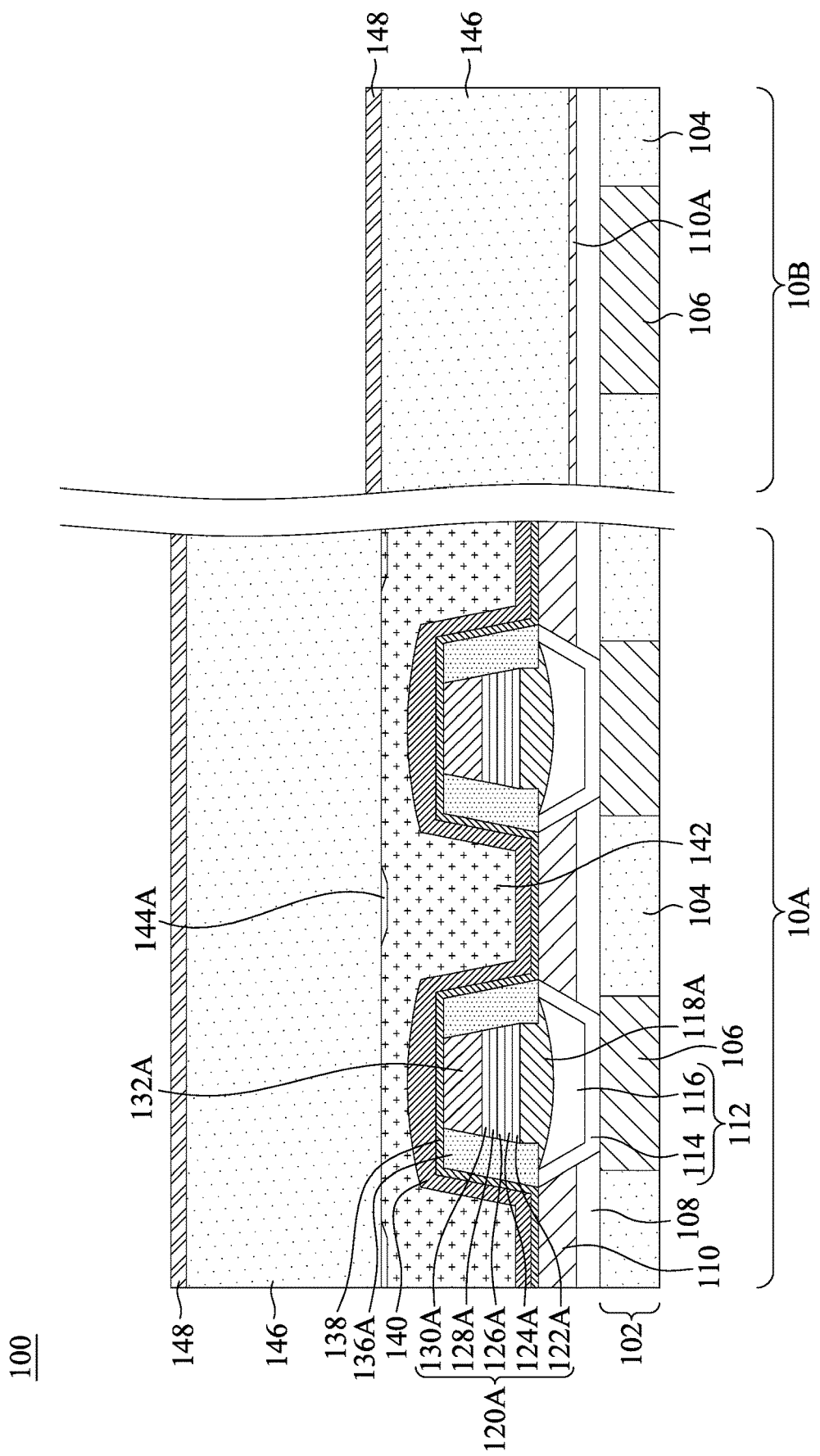

Reference is made to FIG. 14. An inter-metal dielectric (IMD) layer 146 is formed covering the dielectric layer 142 on the memory region 10A and on the dielectric layer 110 on the periphery region 10B. A portion of the IMD layer 146 within the peripheral region 10B has a bottommost position lower than a bottommost position of the dielectric layer 142 within the memory region 10A. The IMD layer 146 may, for example, be an ELK dielectric material and/or some other suitable dielectric materials. The ELK dielectric material may, for example, have a dielectric constant less than about 2.5, 2.0, or some other suitable value and/or may, for example, be or comprise porous SiOC and/or some other suitable ELK dielectric material(s). In some embodiments, the IMD layer 146 is formed by LPCVD or other suitable deposition process. An etch stop layer 148 is then formed over the IMD layer 146. In various embodiments, the etch stop layer 148 may be formed by a vapor deposition technique (e.g., physical vapor deposition, chemical vapor deposition, etc.) and include a silicon nitride (SiN) layer, a silicon carbide (SiC) layer, a silicon oxycarbide (SiOC) layer, and/or some other suitable etch stop layers.

Figure 15:
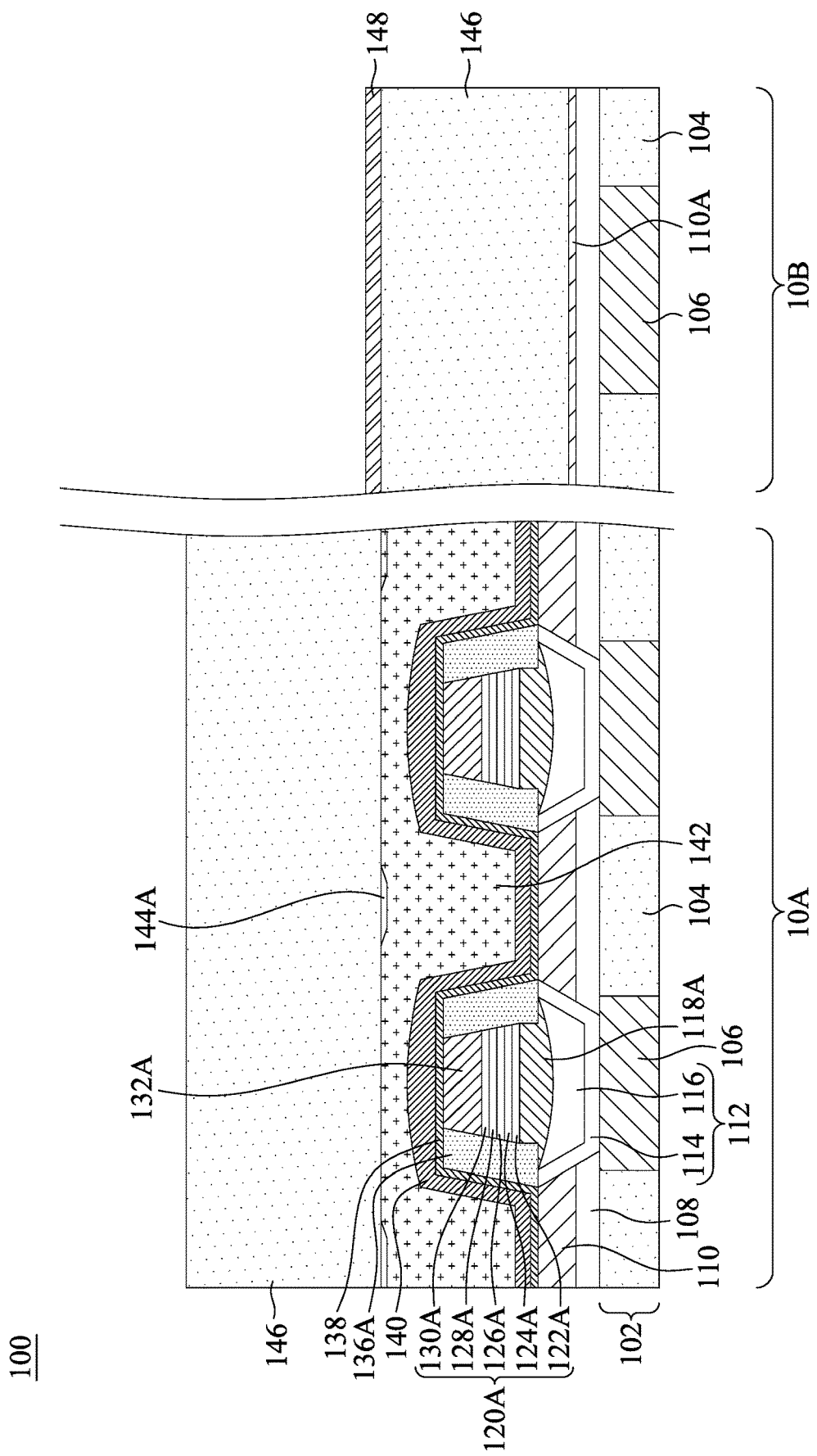

Reference is made to FIG. 15. The etch stop layer 148 is patterned to expose the IMD layer 146 on the memory region 10A. In other words, a portion of the etch stop layer 148 over the memory region 10A is removed, while leaving another portion of the etch stop layer 148 over the periphery region 10B.

Figure 16:
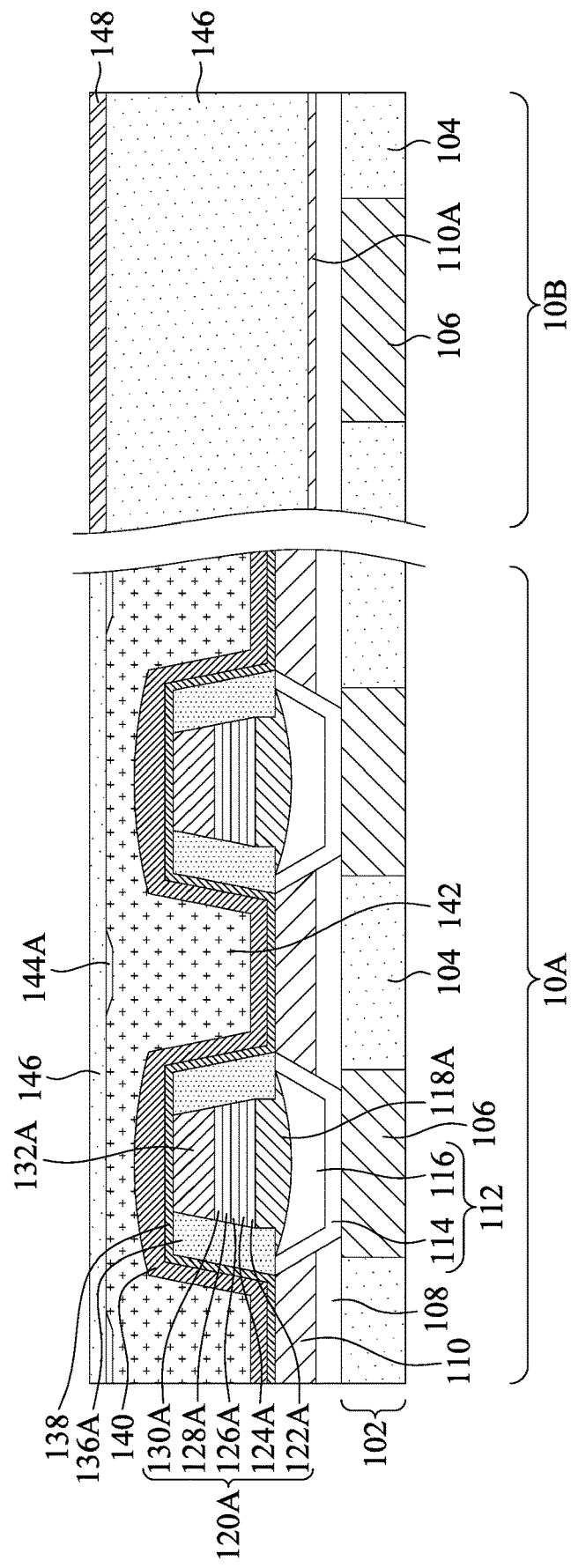

Reference is made to FIG. 16. A CMP process is performed to the IMD layer 146 until a desired thickness is achieved. A portion of the IMD layer 146 within the memory region 10A is thinned after the CMP process, while leaving another portion of the IMD layer 146 within the peripheral region 10B substantially intact. The CMP process uses a slurry that removes the material of the etch stop layer 148 at a slower rate than it removes the material of the IMD layer 146. As a result of the CMP removal rate difference, the etch stop layer 148 aids in the end point detection of the CMP process, and thus can serve as a CMP stop layer as well. A top surface of the IMD layer 146 on the memory region 10A is substantially level with a top surface of the etch stop layer 148 on the periphery region 10B because of the CMP process. In some embodiments, the IMD layer 146 over the dielectric layer 142 has a thickness in a range from about 0 angstrom to about 200 angstrom.

Figure 17:
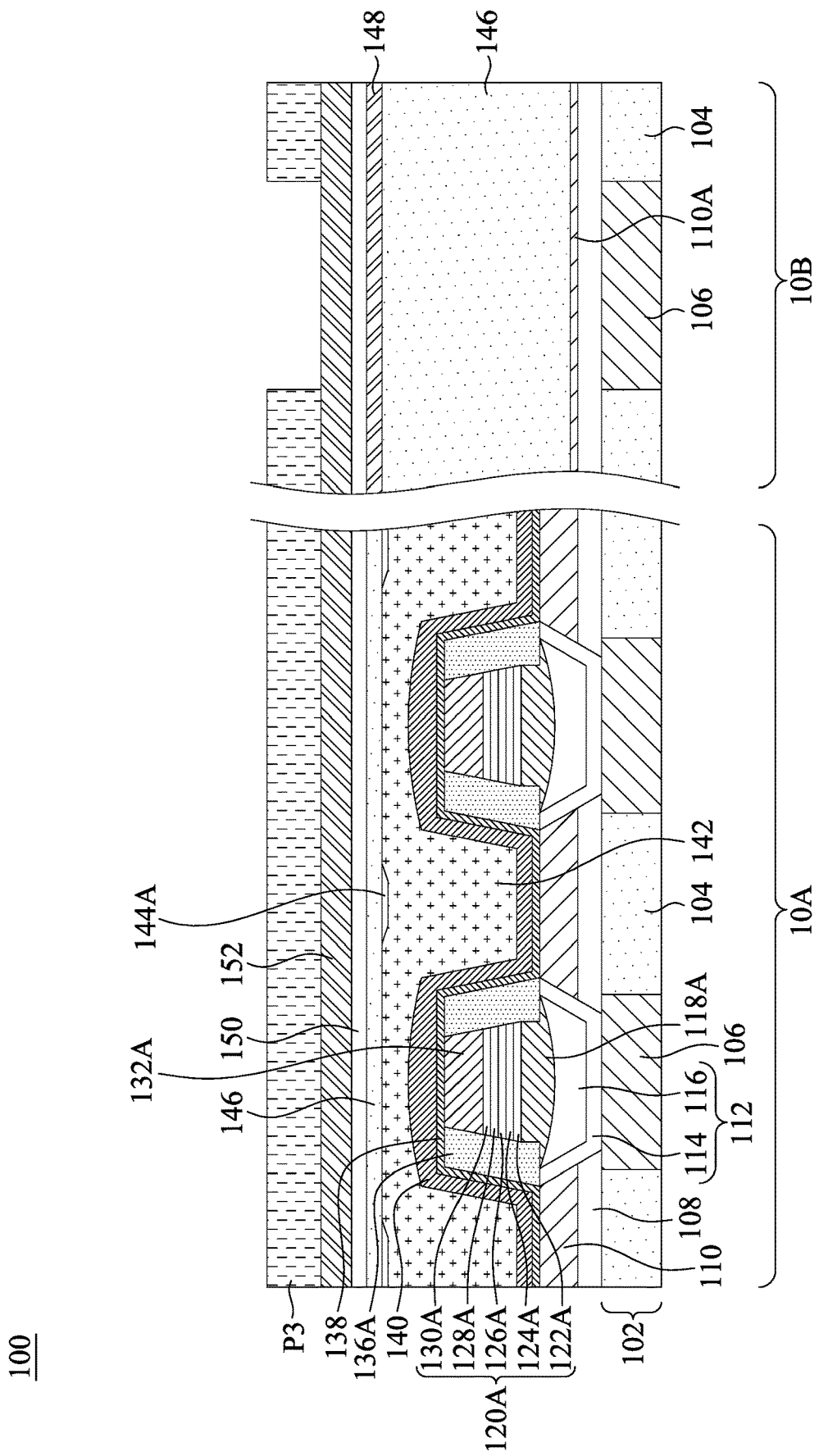

Reference is made to FIG. 17. A nitrogen-free anti-reflective coating (NFARC) layer 150 is formed over the IMD layer 146 on the memory region 10A and over the etch stop layer 148 on the periphery region 10B. A hard mask layer 152 is then formed over the NFARC layer 150. Then, a resist layer is formed over the hard mask layer 152 and then patterned into a patterned resist mask P3 using a suitable photolithography process, such that portions of the hard mask layer 152 are exposed by the patterned resist mask P3. In some embodiments, the patterned resist mask P3 is a photoresist. The patterned resist mask P3 has an opening on the periphery region 10B while having no openings on the memory region 10A. In some embodiments, the patterned resist mask P3 is an ashing removable dielectric (ARD), which is a photoresist-like material generally having generally the properties of a photoresist and amendable to etching and patterning like a photoresist. An exemplary photolithography process may include photoresist coating (e.g., spin-on coating), soft baking, mask aligning, exposure, post-exposure baking, developing the photoresist, rinsing, drying (e.g., hard baking), other suitable processes, or combinations thereof. In some embodiments, the hard mask layer 152 includes amorphous silicon (a-Si), silicon oxide, silicon nitride (SiN), titanium nitride, or other suitable material or composition. In some embodiments, the NFARC layer 150 includes material(s) such as silicon oxide, silicon oxygen carbide, or plasma enhanced chemical vapor deposited silicon oxide.

Figure 18:
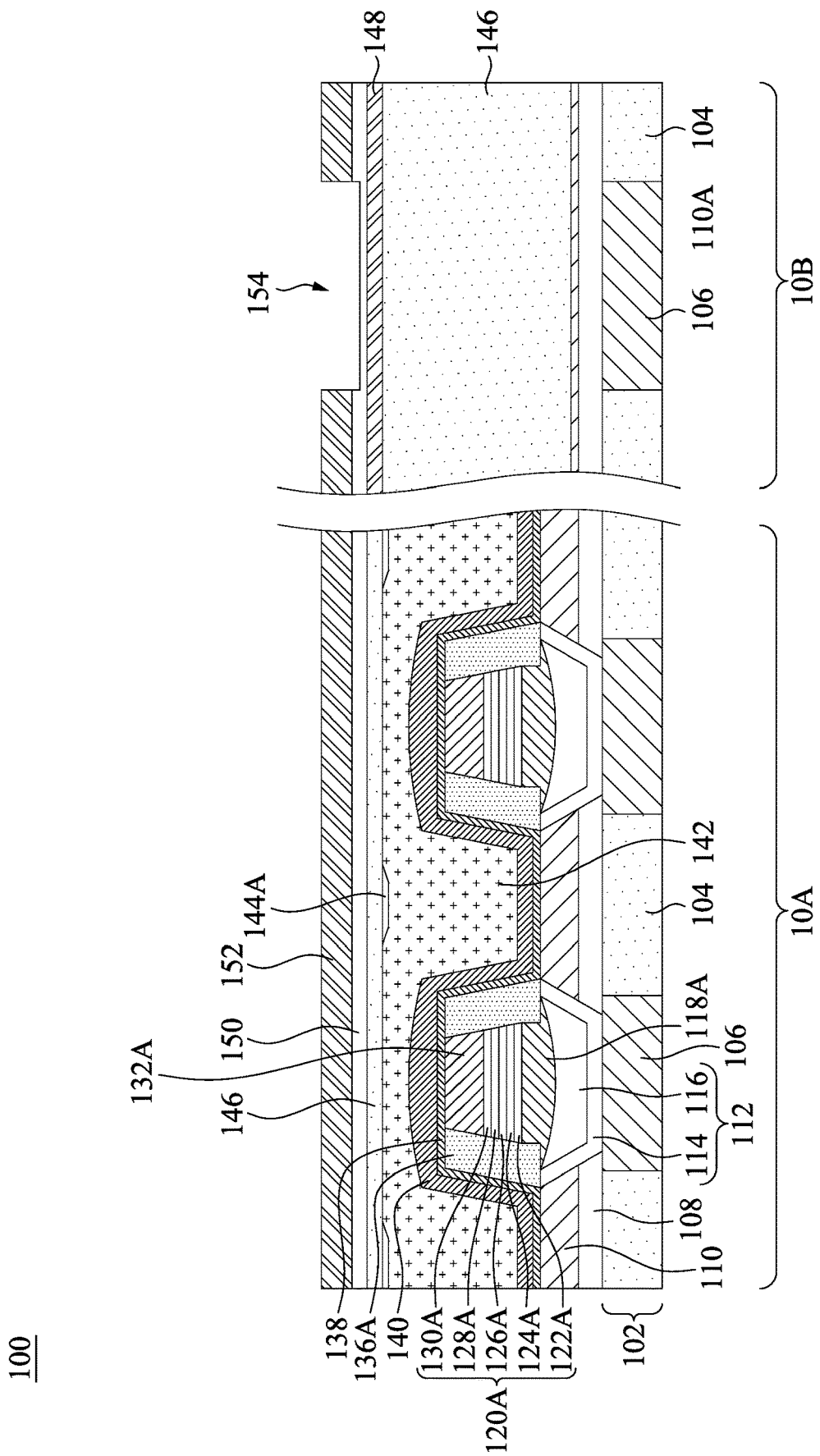

Reference is made to FIG. 18. The pattern of the patterned resist mask P3 is transferred to the hard mask layer 152 to form an opening 154. The NFARC layer 150 is partially removed such that the NFARC layer 150 has a recessed region in the opening 154. The patterned resist mask P3 is removed, for example, by an ashing step.

Figure 19:
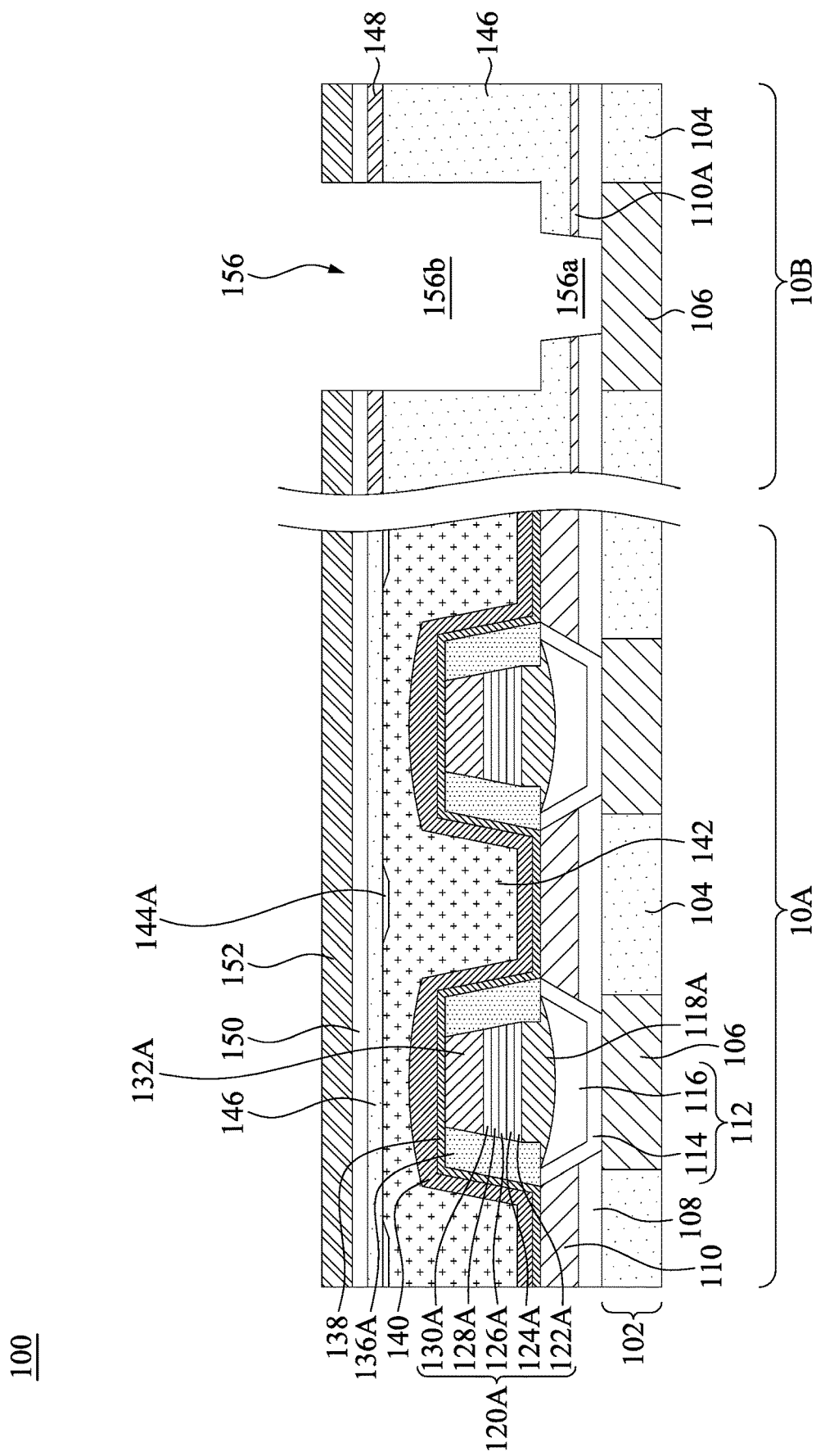

Reference is made to FIG. 19. Afterwards, a trench-via structure 156 for use as a dual damascene cavity is formed in the IMD layer 146. The trench-via structure 156 includes a via hole 156a and a first trench hole 156b. In some embodiments, the trench-via structure 156 is formed by two-patterning-two-etching (2P2E) process. During forming the trench-via structure 156 through the IMD layer 146 and the dielectric layer 110 and the trench hole through the IMD layer 146, the CMP stop layer 140 remains on the top surface of the top electrode 132A. The dielectric layer 142 is substantially un-etched during the two-patterning-two-etching (2P2E) process.

Figure 20:
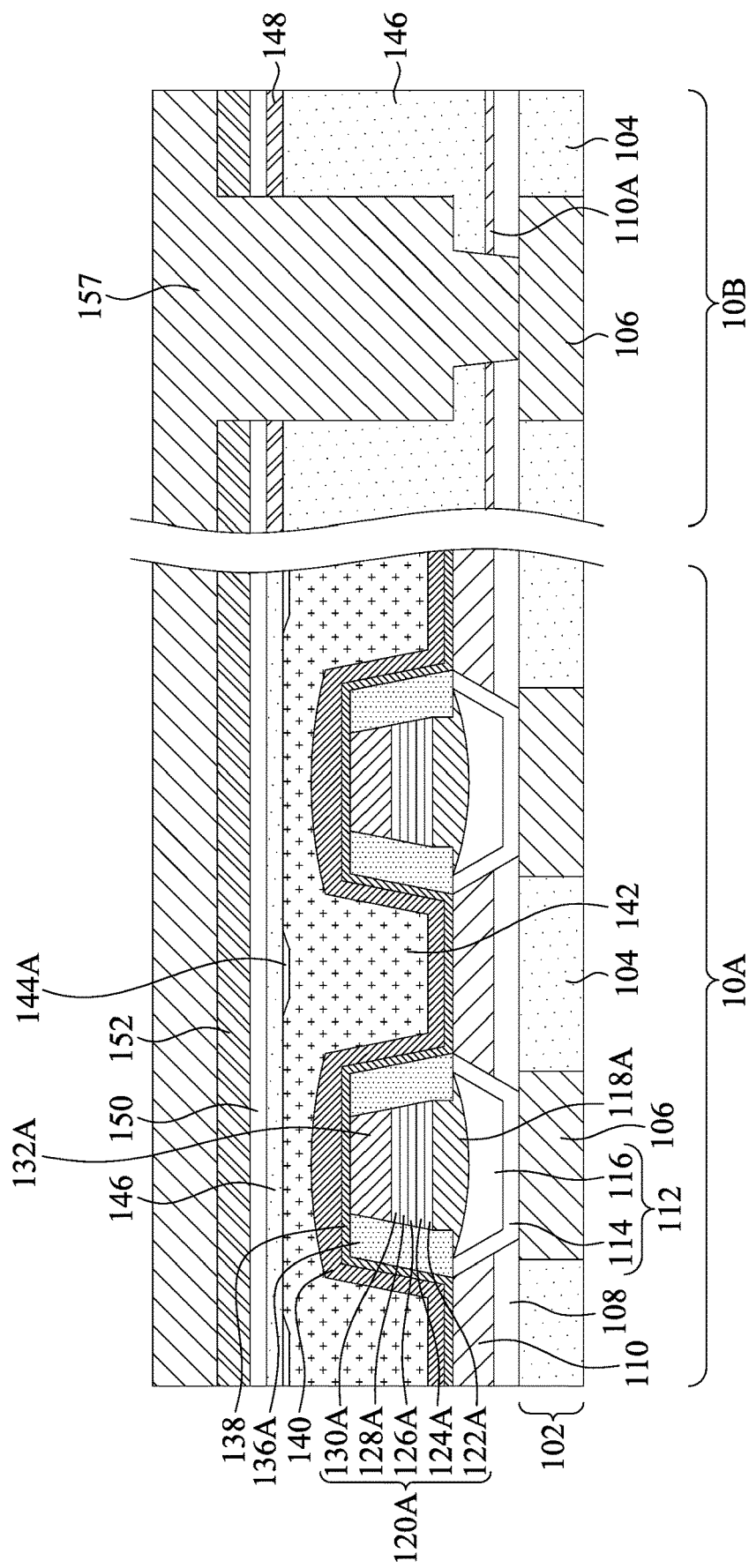

Reference is made to FIG. 20. After the trench-via structure 156 is formed, a conductive material 157 is deposited on the hard mask layer 152 and is sufficiently thick to fill the trench-via structure 156 (see FIG. 19) in accordance with some embodiments of the disclosure. The conductive material 157 may be aluminum, aluminum alloy, copper, copper alloy, titanium, titanium nitride, tantalum, tantalum nitride, tungsten, the like, and/or combinations thereof. In some embodiments, the conductive material 157 and the metallization patterns 106 may be formed of the same material.

Figure 21:
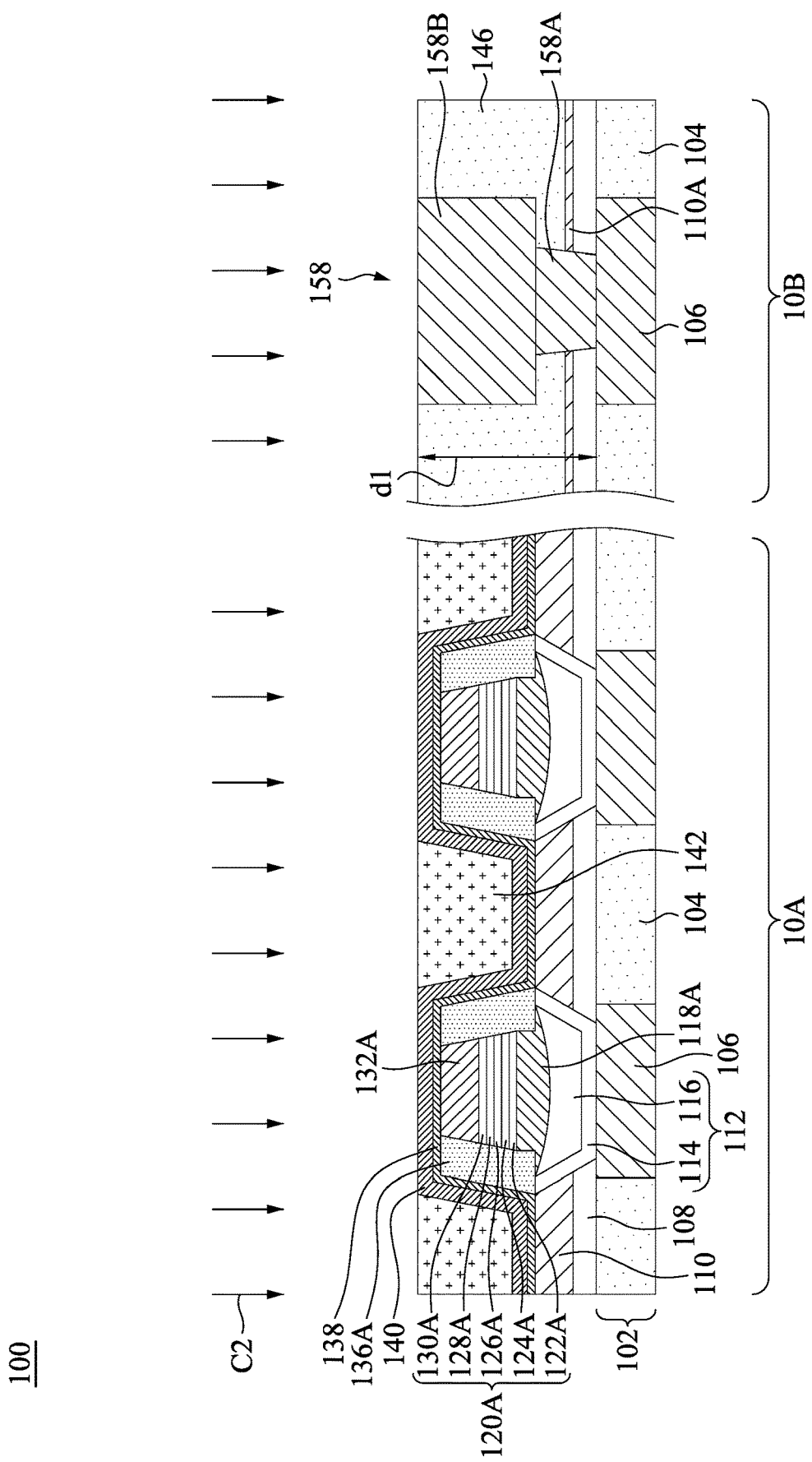

Afterwards, a CMP process C2 is performed on the conductive material 157 to remove the excess materials, as illustrated in FIG. 21. The conductive material 157 (see FIG. 20) constitutes a dual damascene structure 158 which includes a conductive via 158A extending vertically (i.e., having a lengthwise direction perpendicular to top surface of the ILD layer 104) and a metal line 158B extending laterally (i.e., extending in and out of the plane of the drawing sheet, or having a lengthwise direction parallel with a top surface of the ILD layer 104). In some embodiments, the conductive via 158A and the metal line 158B do not have a distinguishable interface therebetween, because they are formed using a same deposition process.

The thinned portion of the IMD layer 146 is entirely removed from the memory region 10A. The CMP process C2 may stop at the CMP stop layer 140. In other words, the CMP process C2 is performed until the CMP stop layer 140 is reached. By stopping at the CMP stop layer 140, unwanted polishing of the top electrode 132A can be avoided. In some embodiments where a material of the top electrode 132A and a material of the dual damascene structure 158 are different, if the top electrode 132A is polished during the CMP process C2, materials of the top electrode 132A dislodged from its top surface may cause contamination problems in the fab. In some embodiments, after the CMP process C2, a distance dl between the top surface of the IMD layer 146 and the top surface of the ILD layer 104 is in a range from about 1350 angstrom to about 1700 angstrom. A bottom surface of the metal line 158B is lower than a top surface of the top electrode 132A, and a top surface of the metal line 158B is higher than the top surface of the top electrode 132A.

Figure 22:
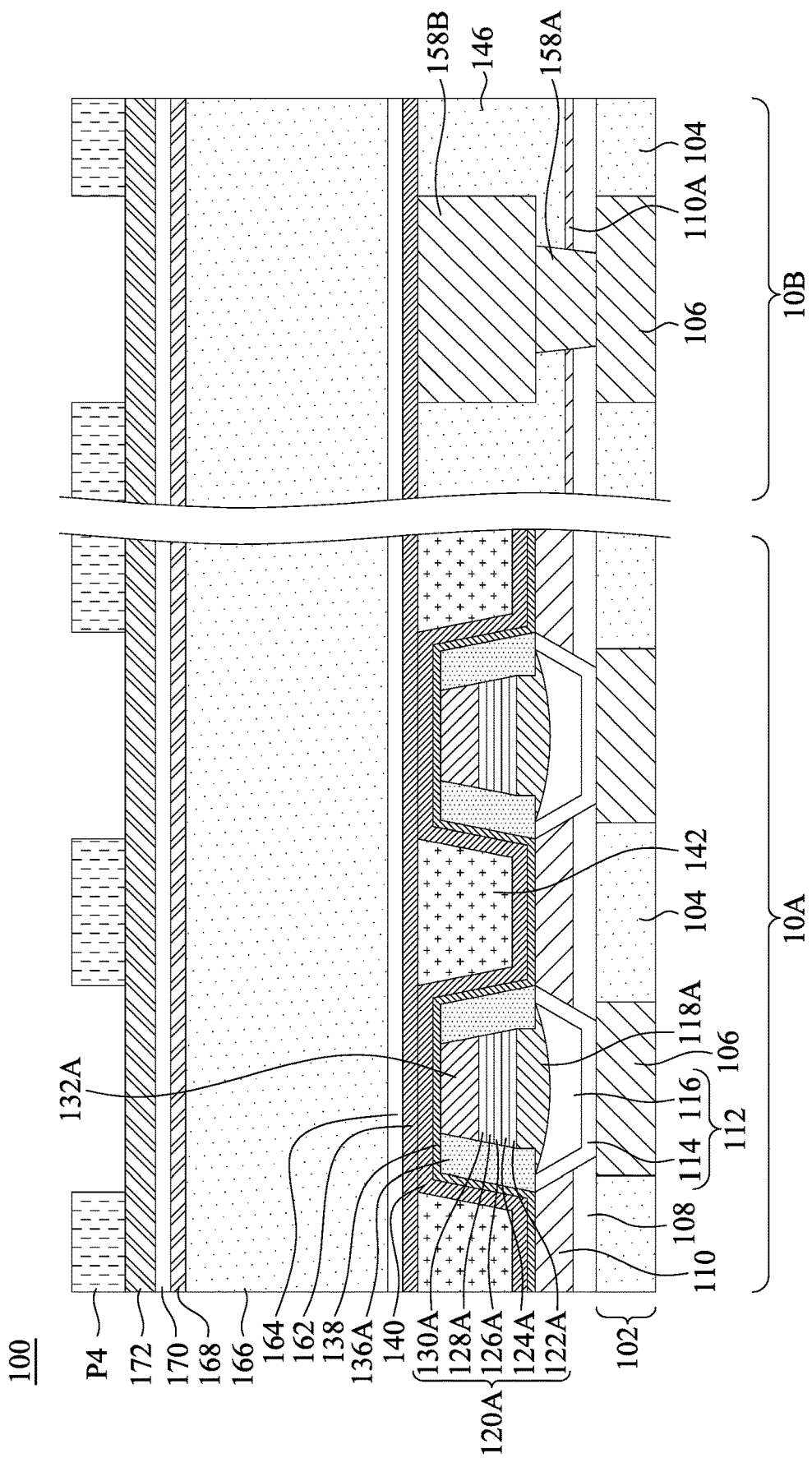

Reference is made to FIG. 22. An etch stop layer 162 and a protective liner layer 164 are blanket deposited over the memory region 10A and the periphery region 10B in sequence. In particular, the etch stop layer 162 is formed over the top surface of the dielectric layer 142 and the exposed top surface of the CMP stop layer 140 on the memory region 10A and over the top surface of the IMD layer 146 and the exposed top surface of the metal line 158B on the periphery region 10B. The protective liner layer 164 extends along the etch stop layer 162. An IMD layer 166 is then deposited over the protective liner layer 164. The etch stop layer 162 is formed of silicon carbide in some embodiments. The protective liner layer 164 is formed of tetraethyl orthosilicate (TEOS) oxide in some embodiments. The IMD layer 166 may be, for example, an extreme low-k dielectric material and/or some other suitable dielectric materials. In some embodiments, the IMD layer 146 is formed by LPCVD or other suitable deposition process.

An etch stop layer 168, a nitrogen-free anti-reflective coating (NFARL) layer 170 and a hard mask layer 172 are formed over the IMD layer 166 in sequence. Then, a resist layer is formed over the hard mask layer 172 and then patterned into a patterned resist mask P4 using a suitable photolithography process, such that portions of the hard mask layer 172 are exposed by the patterned resist mask P4. In some embodiments, the patterned resist mask P4 is a photoresist. In some embodiments, the patterned resist mask P4 is an ashing removable dielectric (ARD), which is a photoresist-like material generally having generally the properties of a photoresist and amendable to etching and patterning like a photoresist. An exemplary photolithography process may include photoresist coating (e.g., spin-on coating), soft baking, mask aligning, exposure, post-exposure baking, developing the photoresist, rinsing, drying (e.g., hard baking), other suitable processes, or combinations thereof. In some embodiments, the hard mask layer 172 includes amorphous silicon (a-Si), silicon oxide, silicon nitride (SiN), titanium nitride, or other suitable material or composition. In some embodiments, the NFARC layer 170 includes material(s) such as silicon oxide, silicon oxygen carbide, or plasma enhanced chemical vapor deposited silicon oxide.

Figure 23:
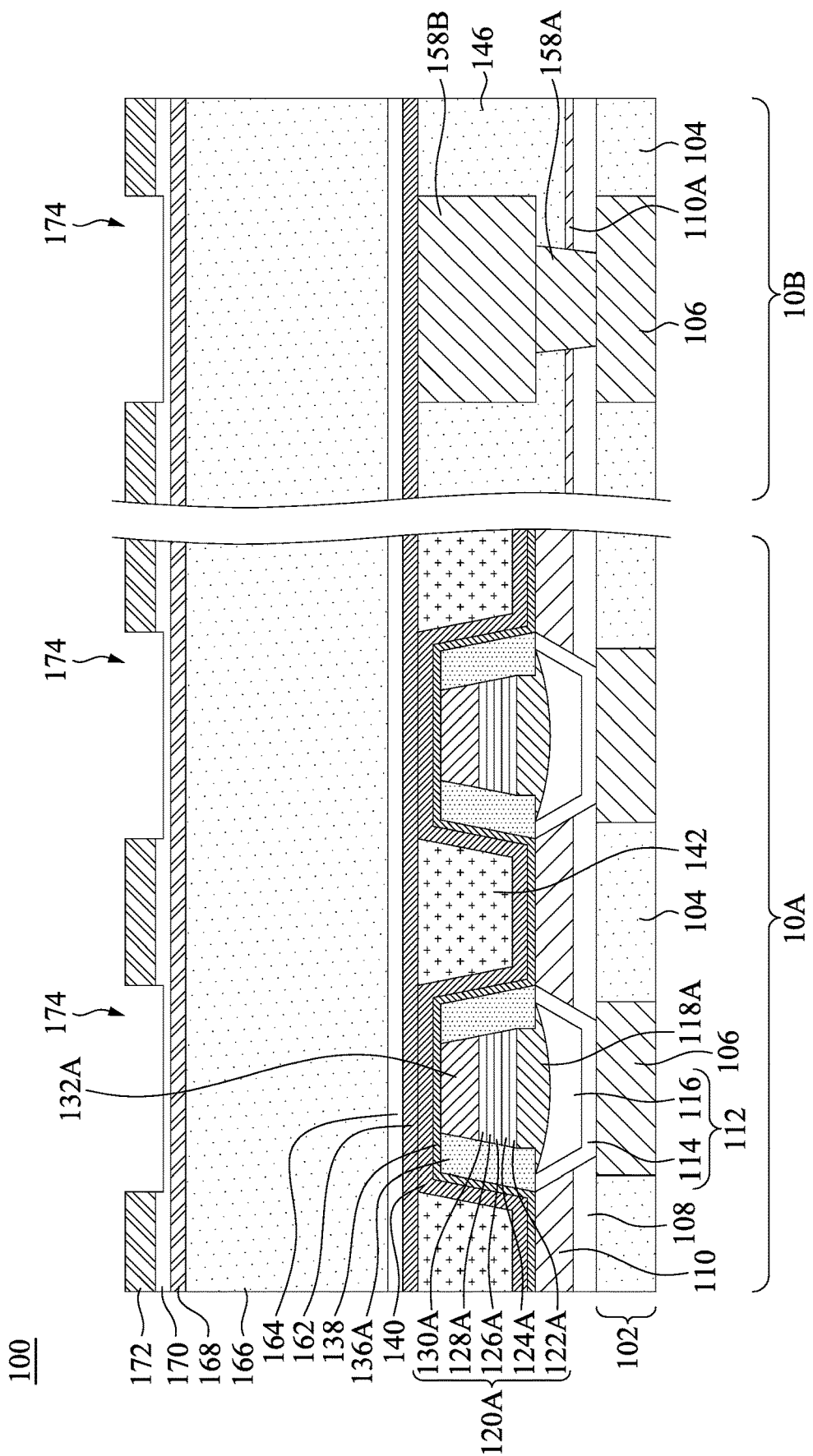

Reference is made to FIG. 23. The pattern of the patterned resist mask P4 is transferred to the hard mask layer 172 to form a trench pattern 174. The NFARC layer 170 is partially removed such that the NFARC layer 170 has a recessed region in the trench pattern 174. The patterned resist mask P4 is removed, for example, by an ashing step.

Figure 24:
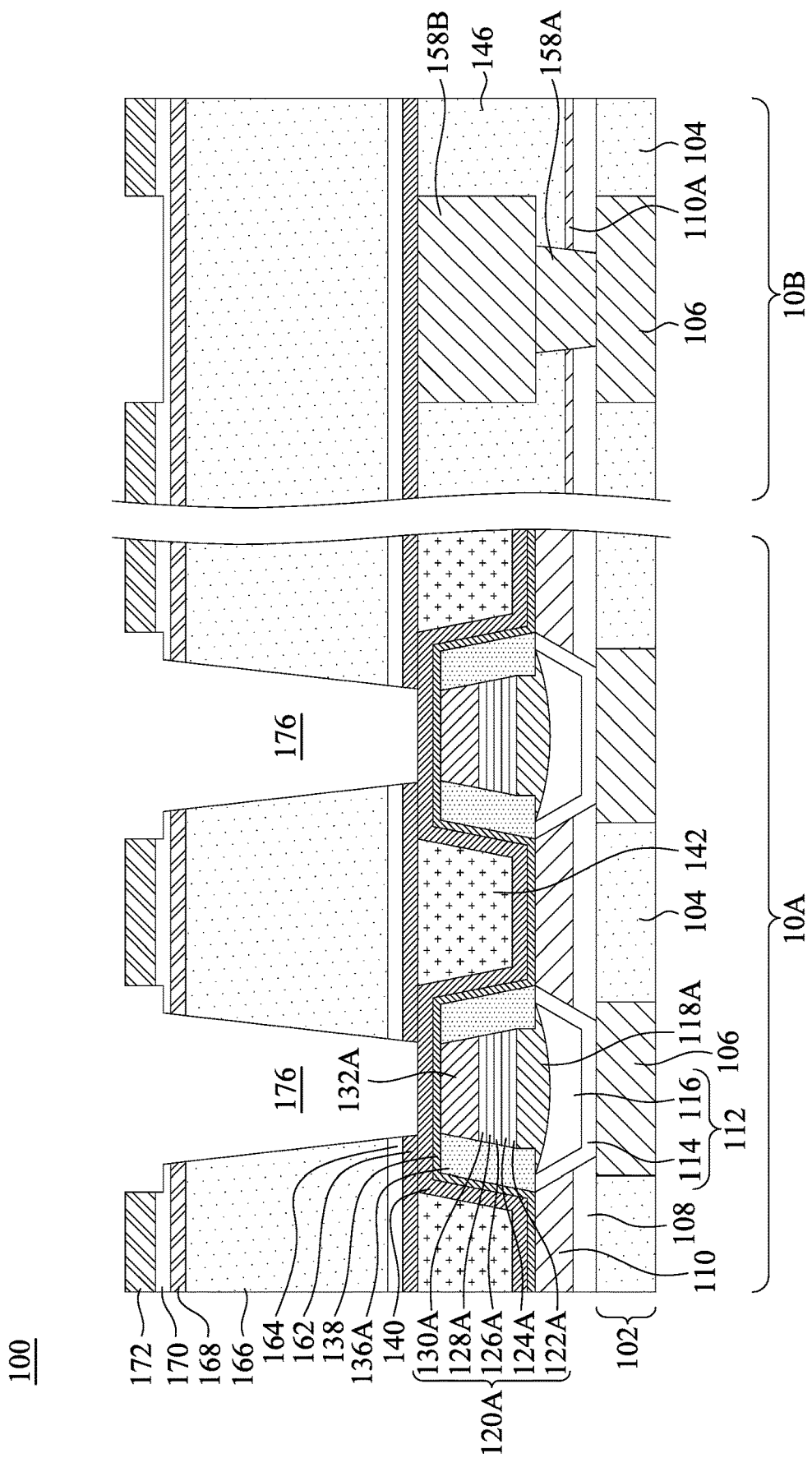

A photo mask layer (not shown) containing a via pattern is next formed over the trench pattern 174 and partially over the hard mask layer 172 on the memory region 10A. The via pattern is then etched into the NFARC layer 170, the etch stop layer 168, the IMD layer 166, the protective liner layer 164 and the etch stop layer 162 to form via openings 176, and the etch stops on the CMP stop layer 140. Since the dielectric layer 142 directly over the MTJ stack 120A is removed during the CMP process C2, the remaining dielectric layer 142, which laterally surrounds the MTJ stack 120A, is substantially un-etched. In other words, the remaining dielectric layer 142 remains substantially intact during forming the via openings 176. As a result, the CMP stop layer 140 is exposed to the via openings 176. After the etching of the NFARC layer 170, the etch stop layer 168, the IMD layer 166, the protective liner layer 164 and the etch stop layer 162, the photo mask layer is removed by ashing, as shown in FIG. 24.

Figure 25:
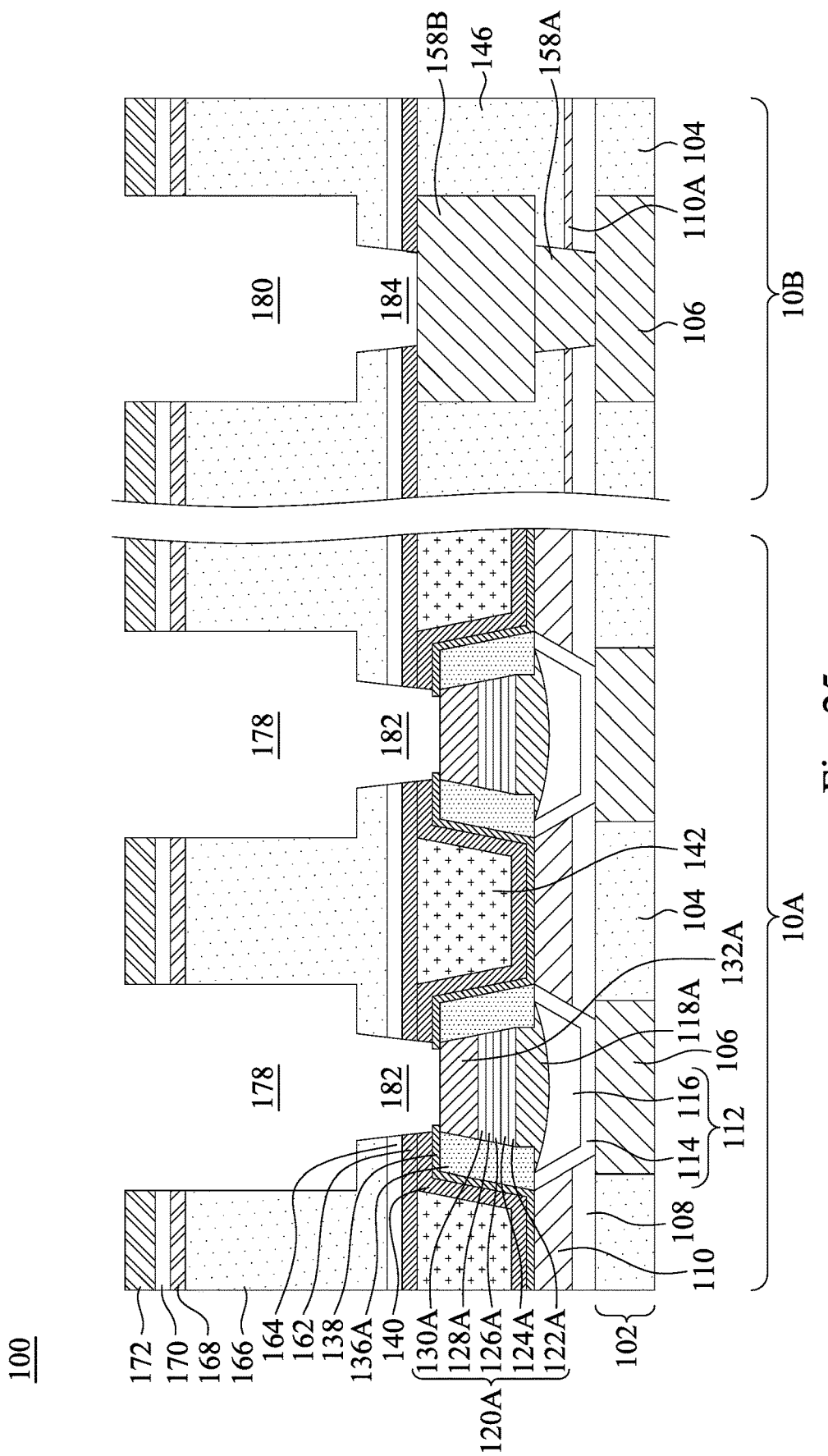

The trench pattern 174 and the via openings 176 are dry etched to increase the depths of the trench pattern 174 and the via opening 176, until the via openings 176 reaches the top electrode 132A to form a first via hole 182 and a first trench 178, as shown in FIG. 25. The remaining dielectric layer 142 remains substantially intact during forming the first via hole 182 and the first trench 178. As a result, the top electrode 132A is exposed to the first via hole 182. A dual damascene cavity including a second trench 180 contiguous with a second via hole 184 through the IMD layer 166, protective liner layer 164, and the etch stop layer 162 is formed on the periphery region 10B by the dry etching. As a result, the metal line 158B are partially exposed to the second via hole 184.

Reference is made to FIG. 26. In some embodiments, a conductive material 185 is deposited on the hard mask layer 172 and is sufficiently thick to fill the first and second trenches 178, 180 and the first and second via holes 182, 184 (see FIG. 25).

Figure 27:
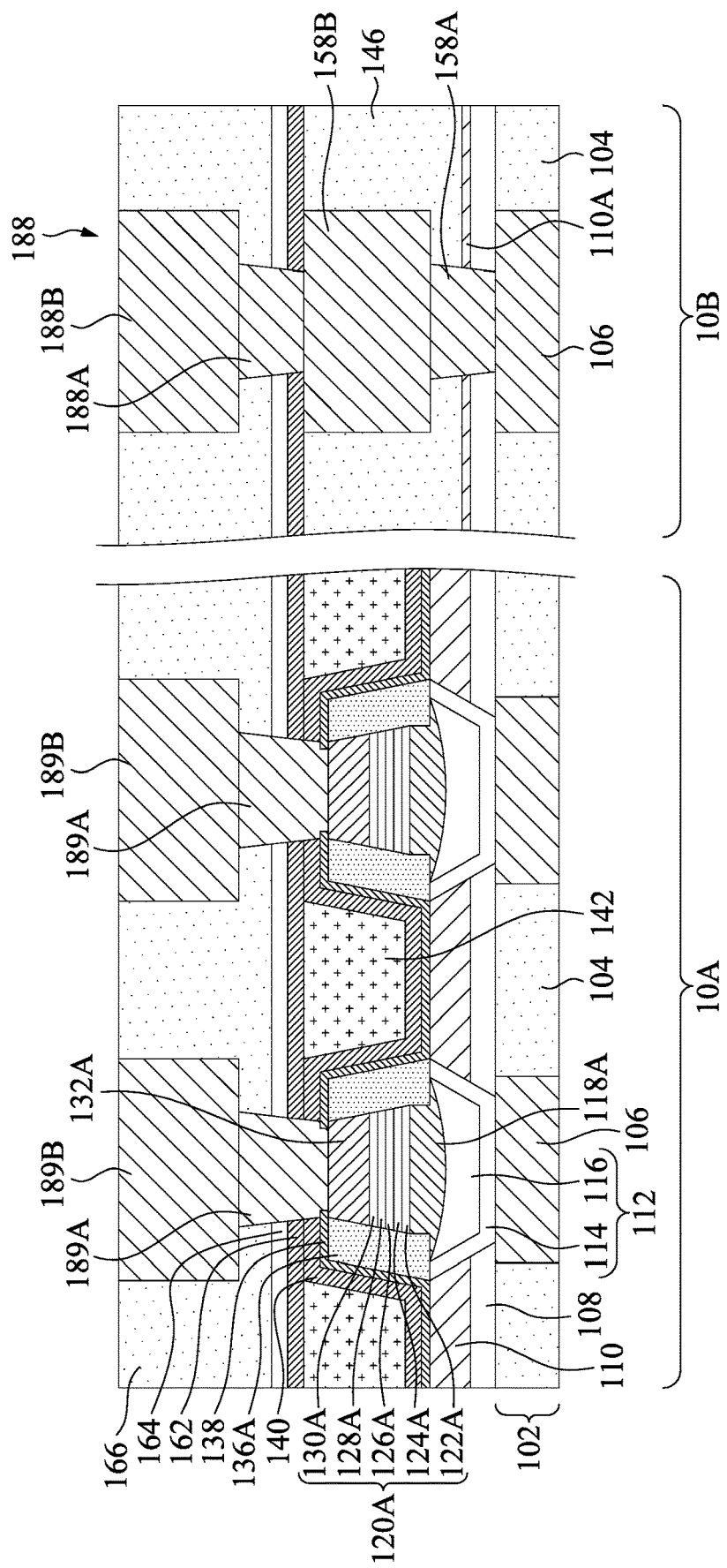

A CMP process is subsequently performed on the conductive material 185 to remove excess materials, as illustrated in FIG. 27. The conductive material 185 constitutes a top electrode via (TEVA) 189A and a metal line 189B on the memory region 10A and an interconnect structure 188 on the periphery region 10B. The interconnect structure 188 includes a conductive via 188A and a metal line 188B. A top surface of the TEVA 189A is higher than the top surface of the metal line 158B. The TEVA 189A and the conductive via 188A extend vertically. The metal line 189B and the metal line 188B extend laterally. In some embodiments, the conductive via 188A and the metal line 188B do not have a distinguishable interface therebetween because they are formed using a same deposition process. In some embodiments, the TEVA 189A and the metal line 189B do not have a distinguishable interface therebetween because they are formed using a same deposition process. In some embodiments, the TEVA 189A has a bottom width in a range from about 40 nm to about 50 nm. The remaining IMD layer 166 is also removed by the chemical mechanical polishing operation. The conductive material may be a metal deposited using conventional techniques including PVD, ALD, and electroplating. In certain embodiments, barrier layers and metal seed layers are deposited in the trenches and vias, in addition to the interconnect conductive material. In certain embodiments, the interconnect conductive material includes aluminum, copper, and tungsten. Substantially the same amounts of the conductive material on the memory region 10A and on the periphery region 10B are removed during the CMP process, thereby enables compatibility with BEOL processing.

Figure 28:
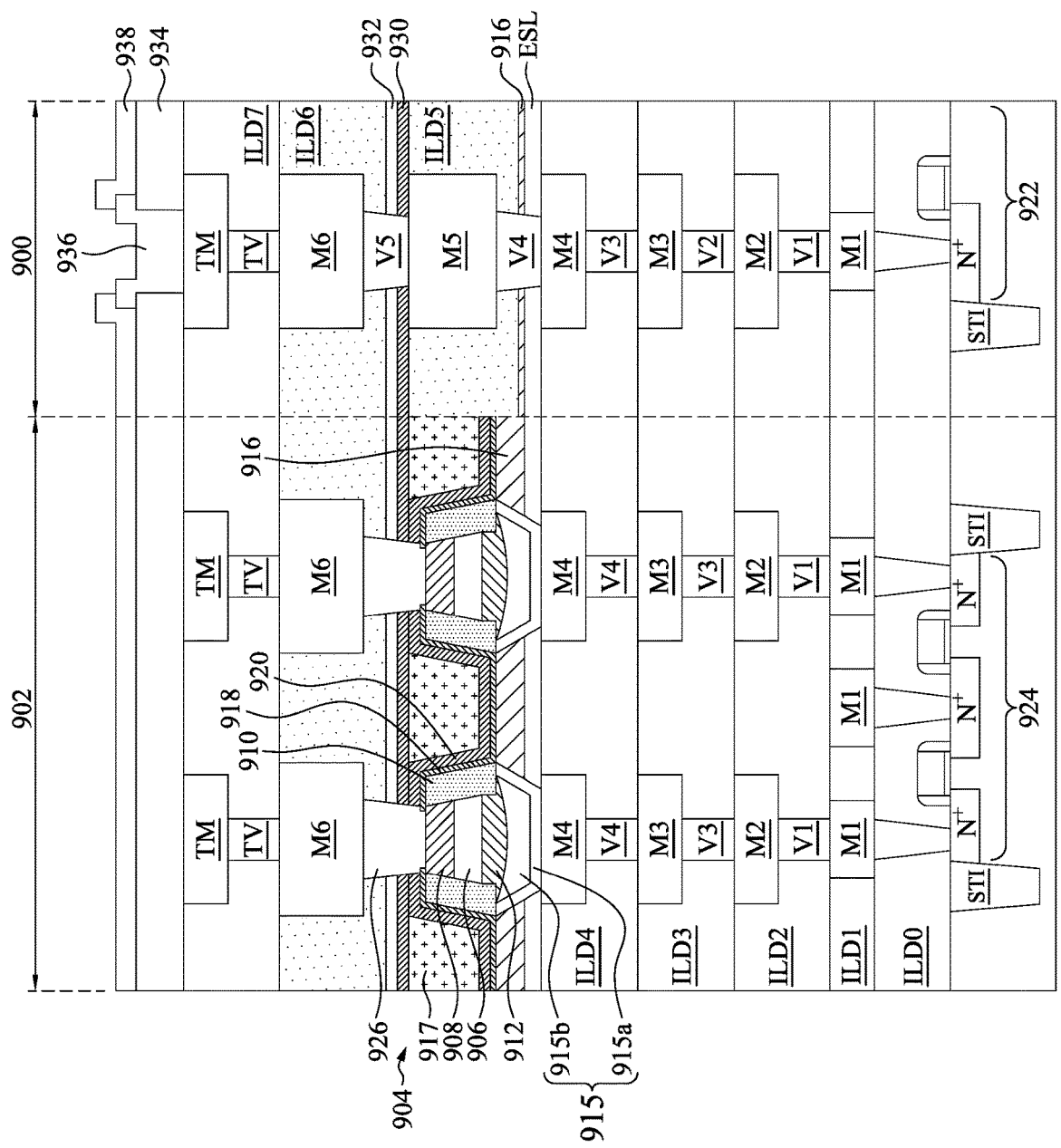
FIG. 28 illustrates an integrated circuit including MRAM devices and a logic device.

FIG. 28 illustrates an integrated circuit including MRAM devices and logic devices. The integrated circuit includes a periphery region 900 and a MRAM region 902. The periphery region 900 may include circuitry, such as the exemplary transistor, for processing information received from MRAM devices 904 in the MRAM region 902 and for controlling reading and writing functions of MRAM devices 904. In some embodiments, the MRAM device 904 includes an MTJ stack 906, a top electrode 908 over the MTJ stack 906, spacers 910, a bottom electrode 912 under the MTJ stack 906, and a BEVA 915 under the bottom electrode 912 and in a dielectric layer 916 and an etch stop layer ESL. The BEVA 915 includes a diffusion barrier layer 915a and a filling metal 915b filling a recess in the diffusion barrier layer 915a. The MRAM device 904 includes an etch stop layer 918 over a top surface of the dielectric layer 916, along a sidewall of the spacer 910 and over a top surface of the spacer 910 and a top surface of the top electrode 908. The MRAM device 904 further includes a CMP stop layer 920 lining the etch stop layer 918. A material of the CMP stop layer 920 is different from a material of the etch stop layer 918. A thickness of a portion of the dielectric layer 916 on the MRAM region 902 is greater than a thickness of another portion of the dielectric layer 916 on the periphery region 900.

As depicted, the integrated circuit is fabricated using five metallization layers, labeled as M1 through M6, with five layers of metallization vias or interconnects, labeled as V2 through V5. A top electrode via (TEVA) 926 is over the top electrode 908. The metallization line M6 and the top electrode 908 are coupled through the TEVA 926. Other embodiments may contain more or fewer metallization layers and a corresponding more or fewer number of vias. Periphery region 900 includes a full metallization stack, including a portion of each of metallization layers M1-M6 connected by interconnects V2-V5, with M1 connecting the stack to a source/drain contact of logic transistor 922. The MRAM region 902 includes a full metallization stack connecting MRAM devices 904 to transistors 924 in the MRAM region 902, and a partial metallization stack connecting a source line to transistors 924 in the MRAM region 902. MRAM devices 904 are depicted as being fabricated in between the top of the metallization layer M4 and the bottom the metallization layer M6. Also included in integrated circuit is a plurality of ILD layers. Five ILD layers, identified as ILD0 through ILD7 are depicted in FIG. 28 as spanning the periphery region 900 and the MRAM region 902. A dielectric layer 917 is over the CMP stop layer 920 and laterally surrounds the MRAM devices 904. A bottom surface of the metallization line M5 is lower than a top surface of the top electrode 908, and a top surface of the metallization line M5 is higher than the top surface of the top electrode 908. An etch stop layer 930 is between the ILD layer ILD5 and the ILD layer ILD6. A protective liner layer 932 is over the etch stop layer 930.

The integrated circuit further includes a top metal metallization layer TM and a top interconnect TV connected between the top metal metallization layer TM and the metallization layer M6. A passivation layer 934 is deposited over the ILD layer ILD7. The passivation layer 934 is patterned and etched creating an opening in the layer of the passivation layer 934 that overlays and aligns with the top metal metallization layer TM. A layer (not shown) of pure aluminum is deposited over the passivation layer 934. The layer is next patterned and etched to create the bonding pad 936 of pure aluminum which is coupled to the top metal metallization layer TM. The ILD layer ILD7 may be formed of an oxide such as Un-doped Silicate Glass (USG), Fluorinated Silicate Glass (FSG), a low-k oxide, or the like. In some embodiments, the passivation layer 934 is formed of a silicon oxide layer and a silicon nitride layer over the silicon oxide layer. The passivation layer 938 may be formed of polyimide, silicon oxide, silicon nitride, and/or the like. The passivation layer 938 may have an opening, through which bonding pad 936 is exposed.

Based on the above discussions, it can be seen that the present disclosure offers advantages. It is understood, however, that other embodiments may offer additional advantages, and not all advantages are necessarily disclosed herein, and that no particular advantage is required for all embodiments. One advantage is that the CMP stop layer below the dielectric layer can prevent the top electrode from being damaged in case that the dielectric layer is over-polished during the CMP process which is performed to remove excess materials to form a first metal line. Another advantage is that substantially the same amounts of the conductive material on the memory region and on the periphery region are removed during the CMP process which is performed to remove excess materials to form a second metal line above the first metal line on the periphery region and above the top electrode via on the memory region, thereby enables compatibility with BEOL processing.

In some embodiments, a method of forming a magnetic random access memory (MRAM) device includes forming an interconnect structure spanning a memory region and a peripheral region; forming a magnetic tunnel junction (MTJ) stack over the interconnect structure within the memory region; depositing a dielectric layer over the MTJ stack and spanning the memory region and the peripheral region; removing a first portion of the dielectric layer from the peripheral region, while leaving a second portion of the dielectric layer within the memory region; after removing the first portion of the dielectric layer from the peripheral region, forming a first inter-metal dielectric (IMD) layer spanning the memory region and the peripheral region; forming a dual damascene structure through the first IMD layer to a metallization pattern of the interconnect structure within the peripheral region; and after forming the dual damascene structure within the peripheral region, forming a top electrode via (TEVA) in contact with a top electrode of the MTJ stack.

In some embodiments, a method of forming a magnetic random access memory (MRAM) device includes forming a magnetic tunnel junction (MTJ) stack within a memory region of a substrate and a top electrode on the MTJ stack; forming a chemical mechanical polishing (CMP) stop layer over the MTJ stack; forming a dielectric layer over the CMP stop layer; performing a first CMP process on the dielectric layer at least until the CMP stop layer is exposed; after performing the first CMP process, forming an IMD layer over the CMP stop layer; performing a first etching step to form a via opening in the IMD layer, in which the first etching step stops on the CMP stop layer; performing a second etching step to extend the via opening down through the CMP stop layer at least until the top electrode is exposed; and after performing the second etching step, forming a top electrode via (TEVA) in the via opening.

In some embodiments, a magnetic random access memory (MRAM) device includes a substrate, a magnetic tunnel junction (MTJ) stack, a top electrode, and a metal line. The substrate has a memory region and a periphery region. The magnetic tunnel junction (MTJ) stack is over the substrate within the memory region. The MTJ stack includes a pinned layer, a tunneling layer and a free layer. The tunneling layer is over the pinned layer. The free layer is over the tunneling layer. The top electrode is over the MTJ stack. The metal line is over the substrate within the periphery region. A top surface of the top electrode is higher than a bottom surface of the metal line and lower than a top surface of the metal line.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a magnetic random access memory (MRAM) device, the method comprising:
   forming an interconnect structure spanning a memory region and a peripheral region;
   forming a magnetic tunnel junction (MTJ) stack over the interconnect structure within the memory region;
   depositing a dielectric layer over the MTJ stack and spanning the memory region and the peripheral region;
   removing a first portion of the dielectric layer from the peripheral region, while leaving a second portion of the dielectric layer within the memory region;
   after removing the first portion of the dielectric layer from the peripheral region, forming a first inter-metal dielectric (IMD) layer spanning the memory region and the peripheral region;
   forming a dual damascene structure through the first IMD layer to a metallization pattern of the interconnect structure within the peripheral region; and
   after forming the dual damascene structure within the peripheral region, forming a top electrode via (TEVA) in contact with a top electrode of the MTJ stack.

2. The method of claim 1, further comprising:
   after forming the first IMD layer and before forming the dual damascene structure, forming a patterned resist mask spanning the memory region and the peripheral region, wherein the patterned resist mask has an opening within the periphery region and no opening within the memory region;
   etching a trench-via structure in the first IMD layer and directly below the opening of the patterned resist mask; and
   forming the dual damascene structure in the trench-via structure.

3. The method of claim 1, wherein a portion of the first IMD layer within the peripheral region has a bottommost position lower than a bottommost position of the dielectric layer within the memory region.

4. The method of claim 1, wherein forming the dual damascene structure comprises:
   performing an etching step to form a trench-via structure in the first IMD layer without etching the dielectric layer; and depositing a metal in the trench-via structure to form the dual damascene structure.

5. The method of claim 4, wherein the trench-via opening has a bottom lower than a bottom surface of the dielectric layer.

6. The method of claim 1, further comprising:
after forming the dual damascene structure, forming a second IMD layer spanning the memory region and the peripheral region, wherein the TEVA is formed in the second IMD layer.

7. The method of claim 6, further comprising:
forming a silicon carbide layer spanning the memory region and the peripheral region before forming the second IMD layer, wherein the silicon carbide layer is in contact with the dual damascene structure in the first IMD layer.

8. The method of claim 1, further comprising:
forming a chemical mechanical polishing (CMP) stop layer over the MTJ stack prior to forming the dielectric layer; and
after forming the dual damascene structure, performing a CMP process on the dielectric layer at least until the CMP stop layer is exposed.

9. The method of claim 8, further comprising:
after performing the CMP process, depositing a silicon carbide layer spanning the memory region and the peripheral region, the silicon carbide layer being in contact with the CMP stop layer.

10. The method of claim 8, further comprising:
forming an etch stop layer over the MTJ stack prior to forming the CMP stop layer, wherein a material of the etch stop layer is different from a material of the CMP stop layer.

11. A method of forming a magnetic random access memory (MRAM) device, the method comprising:
forming a magnetic tunnel junction (MTJ) stack within a memory region of a substrate and a top electrode on the MTJ stack;
forming a chemical mechanical polishing (CMP) stop layer over the MTJ stack;
forming a dielectric layer over the CMP stop layer;
performing a first CMP process on the dielectric layer at least until the CMP stop layer is exposed;
after performing the first CMP process, forming an IMD layer over the CMP stop layer;
performing a first etching step to form a via opening in the IMD layer, wherein the first etching step stops on the CMP stop layer;
performing a second etching step to extend the via opening down through the CMP stop layer at least until the top electrode is exposed; and
after performing the second etching step, forming a top electrode via (TEVA) in the via opening.

12. The method of claim 11, further comprising:
prior to forming the IMD layer, forming a first etch stop layer over the CMP stop layer, wherein the first etching step etches through the first etch stop layer such that the CMP stop layer is exposed.

13. The method of claim 12, further comprising
forming an oxide layer over the first etch stop layer prior to forming the IMD layer, wherein a material of the oxide layer is different from a material of the first etch stop layer.

14. The method of claim 11, further comprising:
prior to forming the CMP stop layer, forming a second etch stop layer over the MTJ stack, wherein the second etch step etches through the second etch stop layer.

15. The method of claim 11, wherein the dielectric layer remains substantially intact during the first etching step and the second etching step.

16. The method of claim 11, further comprising:
forming an extreme low-k dielectric (ELK) layer spanning the memory region and a peripheral region of the substrate prior to performing the first CMP process, the ELK layer is higher in the memory region than in the peripheral region.

17. The method of claim 16, further comprising:
performing a second CMP process to thin a portion of the ELK layer within the memory region, while leaving another portion of the ELK layer within the peripheral region substantially intact.

18. The method of claim 17, wherein the first CMP process is performed such that the thinned portion of the ELK layer is entirely removed from the memory region.

19. A method of forming a magnetic random access memory (MRAM) device, the method comprising:
forming an interconnect structure spanning a memory region and a peripheral region;
forming a magnetic tunnel junction (MTJ) stack over the interconnect structure within the memory region;
forming a spacer laterally surrounding the MTJ stack;
depositing a dielectric layer over the MTJ stack and the spacer, wherein the dielectric layer spans the memory region and the peripheral region;
removing a first portion of the dielectric layer from the peripheral region, while leaving a second portion of the dielectric layer within the memory region;
after removing the first portion of the dielectric layer from the peripheral region, forming an inter-metal dielectric (IMD) layer spanning the memory region and the peripheral region, wherein the IMD layer has a via therein being over the periphery region;
depositing a metal layer on the IMD layer, wherein the metal layer fills into the via; and
planarizing the metal layer to expose the second portion of the dielectric layer within the memory region and the IMD layer on the periphery region without exposing the spacer, wherein the metal layer in the via constitutes a dual damascene structure after planarizing the metal layer.

20. The method of claim 19, further comprising:
before forming the dielectric layer, forming an etch stop layer along a sidewall of the spacer and on a top of the MTJ stack; and
after forming the etch stop layer, forming a chemical mechanical polishing (CMP) stop layer lining the etch stop layer, wherein the CMP stop layer has a material different from a material of the etch stop layer.

* * * * *